(12) United States Patent
Akiyoshi

(10) Patent No.: US 7,821,090 B2
(45) Date of Patent: Oct. 26, 2010

(54) SOLID-STATE IMAGE CAPTURING APPARATUS, METHOD FOR MANUFACTURING THE SAME, AND ELECTRONIC INFORMATION DEVICE

(75) Inventor: Mutoh Akiyoshi, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 386 days.

(21) Appl. No.: 12/080,501

(22) Filed: Apr. 3, 2008

(65) Prior Publication Data

US 2008/0265352 A1    Oct. 30, 2008

(30) Foreign Application Priority Data

Apr. 3, 2007    (JP)    ............................. 2007-097461

(51) Int. Cl.
*H01L 31/00*    (2006.01)
(52) U.S. Cl. ................. 257/432; 438/69; 257/E21.001; 257/E23.001
(58) Field of Classification Search ................. 257/432, 257/E21.001, E23.001; 438/69
See application file for complete search history.

(56) References Cited

FOREIGN PATENT DOCUMENTS

| JP | 64-013763 | 1/1989 |
|---|---|---|
| JP | 2003-298038 | 10/2003 |
| JP | 2004-047985 | 2/2004 |
| JP | 2004-510355 | 4/2004 |
| JP | 2004-273951 | 9/2004 |
| JP | 2004-281499 | 10/2004 |
| JP | 2005-353716 | 12/2005 |
| WO | WO-02/27804 | 4/2002 |

*Primary Examiner*—Thao X Le
*Assistant Examiner*—Tanika Warrior
(74) *Attorney, Agent, or Firm*—Edwards Angell Palmer & Dodge LLP; David G. Conlin; Peter J. Manus

(57) ABSTRACT

An image capturing apparatus has a plurality of solid-state image capturing devices each having light receiving sections laminated in a depth direction of a semiconductor substrate. The devices are sequentially arranged in a direction along a substrate surface. Incident light waves having wavelength bands corresponding to depths of respective light receiving sections are detected there and generate signal charges. Bands are associated with light receiving sections by the wavelength dependence of the optical absorption. Trench sections each reach from a light incident surface or an opposite substrate surface to respective light receiving sections that do not overlap each other in a plane view. Electric charge transfer sections transfer electric charges independently from the light receiving sections via side wall portions of their respective trenches to the light incident surface side or the opposite substrate surface side at the time of driving readout gate electrodes at each trench section.

44 Claims, 9 Drawing Sheets

SOLID-STATE IMAGE CAPTURING APPARATUS, METHOD FOR MANUFACTURING THE SAME, AND ELECTRONIC INFORMATION DEVICE

This Nonprovisional application claims priority under 35 U.S.C. §119(a) on Patent Application No. 2007-097461 filed in Japan on Apr. 3, 2007, the entire contents of which are hereby incorporated by reference.

BACKGROUND OF THE INVENTION

1. Field of the Invention

The present invention relates to a solid-state image capturing apparatus (e.g., a CMOS image sensor, a CCD image sensor and the like) where lights with different wavelengths are separated and detected by a plurality of light receiving sections laminated in a depth direction of a semiconductor substrate or a semiconductor layer, a method for manufacturing the solid-state image capturing device, and an electronic information device (e.g., a digital camera, a cell phone device equipped with a camera and the like) using the solid-state image capturing apparatus as an image input device for an image capturing section thereof.

2. Description of the Related Art

In a conventional color solid-state image capturing apparatus represented by a CMOS image sensor, a CCD image sensor and the like, on a plurality of solid-state image capturing devices where a plurality of light receiving sections (a plurality of pixel sections) are arranged in two dimensions and in a matrix and the plurality of light receiving sections perform a photoelectric conversion on incident light so as to generate a signal charge, three or four types of color filters are arranged in a mosaic for respective colors so as to correspond to the respective light receiving sections. With this structure, a color signal corresponding to each color filter is output from a pixel section, and the color signal is computationally processed so as to generate color image data which contain other color signals.

However, in a conventional color solid-state image capturing apparatus having color filters for respective colors arranged in a mosaic thereon, about ⅔ of the incident light is absorbed by color filters of three primary colors, for example. Accordingly, in fact, only the about ⅓ remaining incident light can be used for outputting a color signal, thus causing problems of low light utilization efficiency and low sensitivity.

In addition, in a conventional color solid-state image capturing apparatus, a color signal of only one color can be obtained at each pixel section, and also the signal of each of three primary colors needs to be detected at different pixel sections, other color data at the same location (same pixel section) is obtained from color data detected at different pixel sections by computation.

Further, in a conventional color solid-state image capturing apparatus, because a transfer region for signal charges obtained at each light receiving section are arranged on the same surface, it is difficult to enlarge a size of a light receiving regions of each pixel section, leading to a problem of a drop of a light receiving sensitivity that arises from a downsizing of a size of a pixel section (light receiving section).

Conventionally, such problems described above have been dealt with by improving a light receiving characteristic for each unit pixel section. However, such action by improving a characteristic is already reaching its limits due to miniaturization of pixel section's size, and the drop of a light receiving sensitivity described above is causing to prevent a solid-state image capturing apparatus to be further downsized or to have more pixels.

In order to solve these problems, for example, Reference 1 proposes a solid-state image capturing apparatus with a plurality of light receiving sections (charge accumulation sections) corresponding to each color are laminated in a depth direction in a semiconductor substrate, each of the light receiving sections being provided with transfer paths formed by a high concentration impurity region (high concentration diffusion layer). With this structure, color lights with wavelength bands corresponding to depths of a light receiving section are separated and detected at the light receiving section depending on a wavelength dependency of a optical absorption coefficient of a semiconductor, and signal charges of different colors are read out separately via a transfer path formed with high concentration impurity region, so that a plurality of signal charges are read out.

This conventional solid-state image capturing apparatus, which separates and detects lights with different wavelengths by the light receiving sections laminated in a depth direction of a semiconductor layer, has a pixel section cross-sectional structure in which photodiodes (light receiving sections) generating a signal charge for each color light of blue (B), green (G) and red (R), for example, are sequentially laminated from the surface of a light incident side to a deeper direction. According to this conventional solid-state image capturing apparatus, since color separation at each pixel section is taken place employing wavelength dependency of optical absorption coefficient of silicon, there is no need to provide for a color filter above each pixel section. In addition, since signals of the three primary colors are obtained at respective depths in a pixel section, excellent color images are obtained with high sensitivity and high resolution and further without any problem of false colors.

In addition, Reference 2 proposes a solid-state image capturing apparatus, in which a photoelectric conversion section (light receiving section) is provided on a surface of one side of a semiconductor substrate; an inner wall of a trench provided to reach from the other side of the substrate surface to the photoelectric conversion section is covered with a gate insulation film; a readout gate electrode is embedded in the trench; an accumulation diffusion layer for transferring is provided adjacent to the gate insulation film formed on a side of the trench. With this structure, signal charges at the photoelectric conversion section are read out by voltage application to the readout gate electrode embedded in the trench.

In the conventional solid-state image capturing apparatus with this mode, a light receiving section, a readout gate electrode, and an accumulation diffusion layer for transferring, which reads out a signal charge from the light receiving section, are positioned in order from a light incident surface of the semiconductor substrate in a depth direction in its structure so that it is possible for almost all of the image capturing region in the light incident surface to be formed as a light receiving region. Therefore, the light receiving sensitivity is improved by the enlargement of the light receiving region's size, making it possible to downsize the pixel size even more.

Further, Reference 3 proposes a solid-state image capturing apparatus, in which a light receiving section is provided on a back side of a semiconductor substrate; a wiring layer is provided on a front surface of the semiconductor substrate; and a readout transistor for selectively reading out signal charges from a conductive region configuring the light receiving section to the front a pixel forming circuit formed on a surface side of the semiconductor substrate is provided inside the semiconductor substrate. With this structure, for example, a conductive region, configuring a readout gate inside the semiconductor substrate is provided, and signal charges obtained in the light receiving section are read out.

In the conventional solid-state image capturing apparatus with this mode, the amount of charges accumulatable in a photodiode is increased by the structure to have light coming in from its backside, thereby improving a light receiving sensitivity. Further, by forming a transistor and a readout selection line necessary for reading out inside a semiconductor substrate, the number of transistors and wirings formed on the surface of the semiconductor substrate are reduced allowing the pixel size to be miniaturized.

Reference 1: Japanese Laid-Open Publication No. 2004-273951

Reference 2: Japanese Laid-Open Publication No. 2004-281499

Reference 3: Japanese Laid-Open Publication No. 2005-353994

SUMMARY OF THE INVENTION

However, each of the conventional solid-state image capturing apparatuses described above has the following problems.

In the conventional solid-state image capturing apparatus disclosed in Reference 1 described above, it is necessary to provide a high concentration diffusion layer as a charge transfer path and a readout gate electrode on a substrate surface in between all the pixel sections for respective colors in order to transfer signal charges outputted from the pixel sections. This results in a reduction of a resolution of the solid-state image capturing apparatus due to the area taken for arranging the high concentration diffusion layer and readout gate electrode.

Further, in the conventional solid-state image capturing apparatus disclosed in Reference 1 described above, since the high concentration diffusion layer which connects a light receiving section and a readout gate electrode is provided up to and including the depth of light receiving sections corresponding to respective colors, high readout voltage is needed in order to read out every signal charge accumulated in the light receiving sections. Therefore, it is difficult to apply the conventional solid-state image capturing apparatus disclosed in Reference 1 directly for a CMOS image sensor used for low electricity consumption purpose. If read out is performed with a low voltage used for a CMOS image sensor, signal charges will not be read out completely and they will be left in a light receiving section, leading to defect of causing a residual image to degrade an image quality.

In the conventional solid-state image capturing apparatus disclosed in Reference 2 described above, since only one color signal can be obtained for each pixel section, a signal for each of the three primary colors needs to be detected at a different pixel section. In this case, since light receiving sections for respective colors are arranged on the same surface, it is difficult to enlarge a size of a light receiving region in each pixel section, and its light receiving sensitivity decreases as the area of the light receiving region is downsized. Further, with this structure, since a color filter needs to be provided and therefore use efficiency for incident light decreases for the amount of the light absorbed by the color filter, a problem of decreasing of light receiving sensitivity occurs.

In addition, if the laminated light receiving sections proposed in the Reference 1 described above are applied directly in the conventional solid-state image capturing apparatus disclosed in Reference 2 described above, a trench configuring a readout gate will be adjacent to all of the light receiving sections laminated, making it impossible to read out a signal charge for each color independently and separately.

In a case of the solid-state image capturing apparatus disclosed in Reference 3 described above, as similar to the case for Reference 2 described above, since only one color signal can be obtained for each pixel section, a signal for each of the three primary colors needs to be detected at a different pixel section, and since light receiving sections for respective colors are arranged on the same surface, it is difficult to enlarge an area of a light receiving region of each pixel section, and its light receiving sensitivity decreases as the area of the light receiving region is downsized. Moreover, color filters need to be provided with this structure as well, and a use efficiency of incident light and a light receiving sensitivity is reduced for that reason.

Further, if the laminated light receiving sections proposed in Reference 1 described above are applied directly in the conventional solid-state image capturing apparatus disclosed in Reference 3, only a deepest light receiving section from a light incident surface can read out signal charges, making it impossible to read out a signal charge for each color independently and separately.

The present invention solves the conventional problems described above. The objective of the present invention is to provide a solid-state image capturing apparatus having a high sensitivity and high resolution which needs no color filter and is capable of reading out signal charges corresponding to a plurality of colors separately with lower voltage; a method for manufacturing the solid-state image capturing apparatus; and an electronic information device (e.g., a digital camera and a cell phone device equipped with camera) using the solid-state image capturing apparatus as an image input device for an image capturing section thereof.

A Solid-state image capturing apparatus is provided, in which a plurality of solid-state image capturing devices having a plurality of light receiving sections laminated in a depth direction of a semiconductor substrate are arranged according to a sequence in a direction along a substrate surface; and of electromagnetic waves of incident subject light, electromagnetic waves having wavelength bands corresponding to depths of the respective light receiving sections are detected at the respective light receiving sections in accordance with wavelength dependency of optical absorption coefficient of a semiconductor substrate material of the semiconductor substrate; and signal charges are generated, wherein, trench sections are provided in such a way that the trench sections each reach from a light incident surface or a substrate surface opposite from the light incident surface of the semiconductor substrate to locations of the respective light receiving sections that do not overlap each other in a plane view, wherein, readout gate electrodes are provided at each trench sections, and electric charge transfer sections are provided, the electric charge transfer sections being capable of transferring electric charges independently from the plurality of the light receiving sections via sidewall portions of the respective trenches to the light incident surface side or the substrate surface side opposite from the light incident surface at the time of driving the readout gate electrodes, thereby the objective described above being achieved.

Preferably, in a solid-state image capturing apparatus according to the present invention, the electric charge transfer sections are arranged in such a way that the trench sections are arranged adjacent to respective layers of the laminated light receiving sections in respective substrate plane directions, inner wall of the trench sections are covered with a gate insulation film, and the readout gate electrode is embedded inside each of the trench sections.

Still preferably, in a solid-state image capturing apparatus according to the present invention, a reverse conducting diffusion layer having an electric polarity different from that of the plurality of the light receiving sections is provided on a side wall of the trench sections along the gate insulation film covering the side wall.

Still preferably, in a solid-state image capturing apparatus according to the present invention, an accumulation diffusion layer is provided, which is adjacent to the gate insulation film on the light incident surface or the substrate surface opposite from the light incident surface and is separated from each of the light receiving sections, and a channel region is provided in the reverse conducting diffusion layer to transfer signal charges from the light receiving section to the accumulation diffusion layer.

Still preferably, in a solid-state image capturing apparatus according to the present invention, the channel region is a channel diffusion layer whose electric polarity is different from that of the light receiving section.

Still preferably, in a solid-state image capturing apparatus according to the present invention, a low concentration channel diffusion layer is formed in a region where a region for forming each of the plurality of the light receiving sections and the channel region overlap each other.

Still preferably, in a solid-state image capturing apparatus according to the present invention, the solid-state image capturing devices adjacent to each other in a direction along the substrate surface are electrically separated from each other as an individual device by the reverse conducting diffusion layer provided on a side surface of the trenches with the depth from either the substrate surface opposite from the light incident surface or from the light incident surface to each of the plurality of the light receiving sections.

Still preferably, in a solid-state image capturing apparatus according to the present invention, the plurality of the light receiving sections are arranged in a square or rectangle lattice shape in a plane view, and the trench sections are arranged in different two or three directions along the respective edges in such a way that the trench sections are adjacent to the respective edges that are extended from a shape in which the plurality of the light receiving sections overlaps with each other in a plane view towards outside so that the extended edges do not overlap with each other in a plane view.

Still preferably, in a solid-state image capturing apparatus according to the present invention, the plurality of the light receiving sections are arranged in a hexagon and a honeycomb structure in a plane view, and the trench sections are arranged in different two or three directions along the respective edges in such a way that the trench sections are adjacent to the respective edges that are extended from a shape in which the plurality of the light receiving sections overlaps with each other in a plane view towards outside so that the extended edges do not overlap with each other in a plane view.

Still preferably, in a solid-state image capturing apparatus according to the present invention, the plurality of the light receiving sections are arranged in a square or rectangle lattice shape in a plane view, and the trench sections are arranged in different four directions along the respective portions of the edges in such a way that the trench sections are adjacent to the respective portions of the edges that are extended from a shape in which the plurality of the light receiving sections overlaps with each other in a plane view towards outside so that the extended portions of the edges do not overlap with each other in a plane view.

Still preferably, in a solid-state image capturing apparatus according to the present invention, the semiconductor is a silicon substrate with an epitaxial layer, and the plurality of the light receiving sections are formed with photodiodes that are formed by semiconductor junction of different conductivity.

Still preferably, in a solid-state image capturing apparatus according to the present invention, there is provided an N number (N is a natural number) of light receiving sections, as the plurality of the light receiving sections, from a first light receiving section for detecting an electromagnetic wave of a first wavelength band to an Nth light receiving section for detecting an electromagnetic wave of an Nth wavelength band.

Still preferably, in a solid-state image capturing apparatus according to the present invention, there is provided a first light receiving section for detecting an electromagnetic wave of a first wavelength band and a second light receiving section for detecting an electromagnetic wave of a second wavelength band as the plurality of the light receiving sections.

Still preferably, in a solid-state image capturing apparatus according to the present invention, there is provided a first light receiving section for detecting an electromagnetic wave of a first wavelength band, a second light receiving section for detecting an electromagnetic wave of a second wavelength band and a third light receiving section for detecting an electromagnetic wave of a third wavelength band as the plurality of the light receiving sections.

Still preferably, in a solid-state image capturing apparatus according to the present invention, there is provided a first light receiving section for detecting an electromagnetic wave of a first wavelength band and a second light receiving section for detecting an electromagnetic wave of a second wavelength band, a third light receiving section for detecting an electromagnetic wave of a third wavelength band, and a fourth light receiving section for detecting an electromagnetic wave of a fourth wavelength band as the plurality of the light receiving sections.

Still preferably, in a solid-state image capturing apparatus according to the present invention, a depth from a light incident side surface of the semiconductor substrate to the first light receiving section detects white light in the range of greater or equal to 0.2 μm and below or equal to 2.0 μm and a depth from the light incident side surface to the second light receiving section detects infrared light in the range of 3.0 μm±0.3 μm.

Still preferably, in a solid-state image capturing apparatus according to the present invention, the depth from the light incident side surface of the semiconductor substrate to the first light receiving section detects ultraviolet light in the range of greater or equal to 0.1 μm and below or equal to 0.2 μm and the depth from the light incident side surface to the second light receiving section detects white light in the range of greater or equal to 0.2 μm and below or equal to 2.0 μm as the thickness of a depletion layer.

Still preferably, in a solid-state image capturing apparatus according to the present invention, the depth from the light incident side surface of the semiconductor substrate to the first light receiving section detects ultraviolet light in the range of greater or equal to 0.1 μm and below or equal to 0.2 μm and the depth from the light incident side surface to the second light receiving section detects infrared light in the range of 3.0 μm±0.3 μm.

Still preferably, in a solid-state image capturing apparatus according to the present invention, the depth from the light incident side surface of the semiconductor substrate to the first light receiving section is in the range of between above or equal to 0.1 μm and below or equal to 0.4 μm, the depth from the light incident side surface of the semiconductor substrate to the second light receiving section is in the range of between above or equal to 0.4 μm and below or equal to 0.8 μm, and the depth from the light incident side surface of the semiconductor substrate to the third light receiving section is in the range of between above or equal to 0.8 μm and below or equal to 2.5 μm, thereby detecting three primary colors.

Still preferably, in a solid-state image capturing apparatus according to the present invention, the depth from the light incident side surface of the semiconductor substrate to the first light receiving section is in the range of between above or equal to 0.1 μm and below or equal to 0.4 μm, the depth from the light incident side surface of the semiconductor substrate to the second light receiving section is in the range of between above or equal to 0.3 μm and below or equal to 0.6 μm, the depth from the light incident side surface of the semiconductor substrate to the third light receiving section is in the range of between above or equal to 0.4 μm and below or equal to 0.8 μm, and the depth from the light incident side surface of the semiconductor substrate to the fourth light receiving section is in the range between above or equal to 0.8 μm and below or equal to 2.5 μm, thereby detecting the three primary colors and emerald color.

Still preferably, in a solid-state image capturing apparatus according to the present invention, a signal output circuit is provided in each of the plurality of the solid-state image capturing devices to select certain solid-state image capturing devices among the plurality of solid-state image capturing devices to output a signal, the signal output circuit configured by a plurality of transistors that are formed from either the opposite side from the light incident surface side of the semiconductor substrate or the light incident surface side.

Still preferably, in a solid-state image capturing apparatus according to the present invention, the signal output circuit is provided in each of the plurality of the solid-state image capturing devices to select certain solid-state image capturing devices among the plurality of solid-state image capturing devices to output a signal, and the transistors configuring the signal output circuit are provided in and on impurity diffusion layer wells in the solid-state image capturing devices.

Still preferably, in a solid-state image capturing apparatus according to the present invention, the signal output circuit has an amplification transistor for amplifying a signal in response to signal voltage charge-transferred from the light receiving sections to the accumulation diffusion layers and a reset transistor for resetting the signal voltage of the accumulation diffusion layers to predetermined voltage.

Still preferably, in a solid-state image capturing apparatus according to the present invention, a signal output path from the signal output circuit is configured by a wiring layer formed on the opposite side from the light incident surface side of the semiconductor substrate.

Still preferably, in a solid-state image capturing apparatus according to the present invention, the gate insulation film is an oxide film or a high dielectric insulation film.

Still preferably, in a solid-state image capturing apparatus according to the present invention, the oxide film is a silicon oxide film.

Still preferably, in a solid-state image capturing apparatus according to the present invention, the high dielectric insulation film is a hafnium oxide.

Still preferably, in a solid-state image capturing apparatus according to the present invention, the readout gate electrode is made of material including doped silicon material or metal material.

Still preferably, in a solid-state image capturing apparatus according to the present invention, the solid-state image capturing apparatus is a CMOS image sensor or a CCD image sensor.

An electronic information device using the solid-state image capturing device according to the present invention as an image input device, thereby the objective described above being achieved.

A solid-state image capturing apparatus manufacturing method, in which a plurality of solid-state image capturing devices having a plurality of light receiving sections laminated in a depth direction of a semiconductor substrate are arranged according to a sequence in a direction along the substrate surface, and of electromagnetic waves of incident subject light, electromagnetic waves having wavelength bands corresponding to depths of the respective light receiving sections are detected at the respective light receiving sections in accordance with wavelength dependency of optical absorption coefficient of a semiconductor substrate material of the semiconductor substrate; and signal charges are generated, the method including: a light receiving section forming step of forming from a first light receiving section diffusion layer to an Nth light receiving section diffusion layer (N is a natural number) in sequence in a depth direction of the semiconductor substrate in such a manner that overlapping regions of the light receiving section diffusion layers are extended with their respective edges so that each of the light receiving section diffusion layers has a portion not overlapping with that of the other light receiving section diffusion layers in a plane view; a reverse conducting diffusion layer forming step of forming a reverse conducting diffusion layer having an electric polarity that is different from that of each of the light receiving sections, on a light incident surface of the substrate surface; a trench forming step of forming a trench, which has a depth to reach from the substrate surface opposite from the light incident surface to each of the light receiving sections and is arranged to be adjacent to each of the edges of laminated light receiving sections in respective substrate plane directions; a trench side surface diffusion layer forming step of forming a reverse conducting diffusion layer having an electric polarity that is different from that of each of the light receiving sections, on a side surface of the trench; a gate insulation film forming step of forming a gate insulation film in such a way to cover inside the trench; a gate electrode forming step of filling inside the trench to form a readout gate electrode; and an accumulation diffusion layer forming step of forming an accumulation diffusion layer, which is adjacent to the gate insulation film on the substrate surface opposite from the light incident side and is separated from each of the light receiving sections, thereby the objective described above being achieved.

Hereinafter, the functions of the present invention having the structures described above will be described.

According to a solid-state image capturing apparatus of the present invention, solid-state image capturing devices each having a plurality of light receiving sections laminated in a depth direction of semiconductor substrate are arranged according to a sequence in a direction along a plane of the substrate. With this structure, of incident light (electromagnetic wave), light (electromagnetic wave) having wavelength bands corresponding to the depths of the respective light receiving sections are detected at the light receiving sections in accordance with the wavelength dependency of optical absorption coefficient of semiconductor substrate material, and signal charges are generated. Therefore, light components (electromagnetic wave) having different wavelengths are separated and detected at respective light receiving sections without a color filter being provided.

In addition, trench sections having a depth at least reaching light receiving sections are arranged adjacent to respective layers of the laminated light receiving sections in respective different substrate plane directions, and readout gate electrodes are embedded inside the trench sections to transfer signal charges from the light receiving sections. Each of the trenches adjacent to respective light receiving section is not adjacent to other light receiving sections, and therefore, readout voltage can be applied to the readout electrodes to read out signal charges corresponding to each color of the respective light receiving section independently from the light receiving section that is adjacent to that readout gate electrode (trench section). In addition, signal charges can be read out with low readout voltage because the readout gate electrode and the light receiving section are adjacent to each other. Further, because the trench sections are formed at the depths that reach from the substrate surface opposite from the light incident surface to the respective light receiving sections and the readout gate electrodes are not grounded on the substrate surface, it is possible to enlarge the size of the light receiving region to improve its light receiving efficiency.

As described above, it is possible to solve an issue that the location for a readout electrode for at least reading out signals need to be, not a narrow, but a wider trench, an issue that signal readout voltage increases due to a long distance between a readout electrode and a light receiving section or a channel, and an issue of a mixture of colors, the issue of a mixture of colors being solved by reading out signals of respective colors at independent locations and directions.

As described above, productivity for the solid-state image capturing apparatus can be increased because a step of forming a color filter as a manufacturing process related to an optical characteristic unique to the solid-state image capturing apparatus can be eliminated. In addition, because the light receiving sections for respective color signals can be formed by laminating them, a light receiving region of each of the pixel sections may be enlarged, leading to high image quality due to the improved light receiving sensitivity.

In addition, since the readout gate electrodes are formed inside the trench sections of the semiconductor substrate and read out in a vertical direction from the light receiving sections corresponding to respective colors, the readout gate electrodes and the light receiving sections are adjacent to each other; and because the distances between the readout gate electrodes and the channel sections are short, signal charges can be read out by much lower readout voltage, thereby reducing power consumption. Further, since it is not needed to form a high concentration diffusion layer as a transfer path or to provide a readout gate electrode on the substrate surface, an establishment area can be smaller and a size of a light receiving region in each pixel section can be substantially larger, leading to high image quality due to the improved light receiving sensitivity.

Further, since wiring layers are provided on the opposite side surface from the light incident surface, it is not needed to arrange wiring layers in between pixel sections, the wiring layers for transferring signal charges outputted from each pixel section (each light receiving section). Therefore, establishment areas for wiring layers will not cause the solid-state image capturing apparatus to lower its resolution. Further, it is possible to form a transistor on the opposite side from the light incident surface, the transistor being necessary for amplifying signal charges and electrical resetting of signal charges from the light receiving sections. Because the area of the light receiving region of each pixel section is not affected by an area for arranging the transistor, it will not cause the solid-state image capturing apparatus to lower its resolution, and the area of the light receiving region can be larger, leading to high image quality due to the improved light receiving sensitivity. In addition, note that a signal readout circuit and its wiring may be provided on the light incident side (between the light receiving sections; and between adjacent solid-state image capturing devices, for example). In this case, a depth of a trench can be shallow, thereby making the manufacturing easier.

Therefore, according to the present invention, the solid-state image capturing apparatus with high sensitivity and high resolution, which needs no color filter that is needed for a conventional solid-state image capturing apparatus and is capable of reading out signal charges corresponding to a plurality of colors separately with low voltage, can be realized with a simple manufacturing method with a step of forming a color filter eliminated. Further, an electronic information device using the solid-state image capturing apparatus as an image input device for an image capturing section thereof can also be realized.

These and other advantages of the present invention will become apparent to those skilled in the art upon reading and understanding the following detailed description with reference to the accompanying figures.

Figure 1:
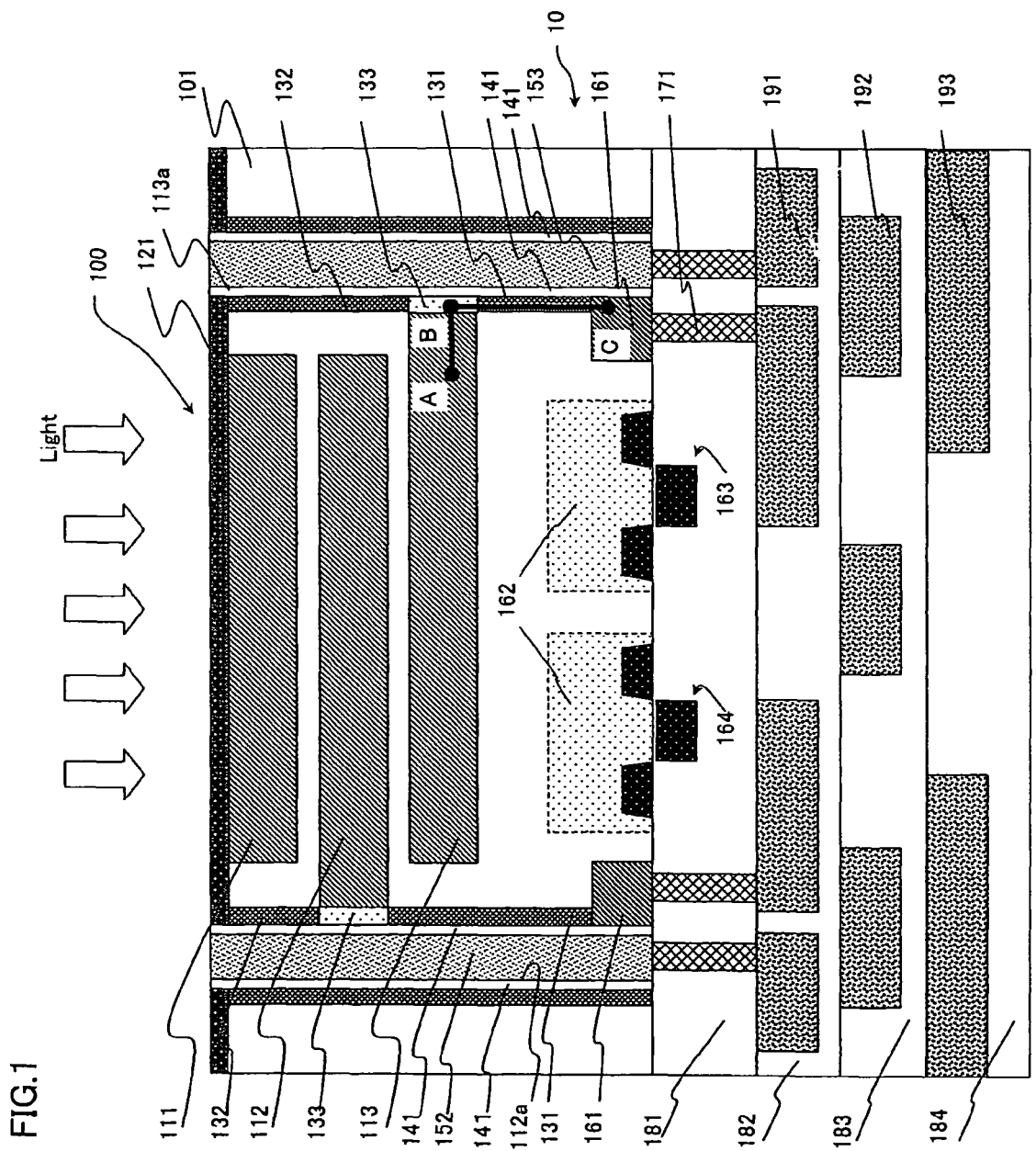
FIG. 1 is a longitudinal cross-sectional view showing an exemplary essential structure of the solid-state image capturing device according to Embodiment 1 of the present invention.

10, 20, 30 solid-state image capturing apparatus
100, 200, 300 solid-state image capturing device
101 semiconductor substrate
111 first light receiving section
112 second light receiving section
113 third light receiving section
121 reverse conducting diffusion layer
122 insulation film
131 channel diffusion layer
132 reverse conducting diffusion layer
133 low concentration channel diffusion layer
141 gate insulation film
151, 152, 153 readout gate electrode
161 accumulation diffusion layer
162 well
163 amplification transistor
164 reset transistor
171 via contact
181, 182, 183, 184 interlayer insulation film
191, 192, 193 wiring layer
211, 311 (region for forming) first light receiving section
212, 312 (region for forming) second light receiving section
213, 313 (region for forming) third light receiving section
314 (region for forming) fourth light receiving section
251, 351 region for forming the readout gate electrode for the first light receiving section
252, 352 region for forming the readout gate electrode for the second light receiving section
253, 353 region for forming the readout gate electrode for the third light receiving section
354 region for forming the readout gate electrode for the fourth light receiving section

DESCRIPTION OF THE PREFERRED EMBODIMENTS

Hereinafter, Embodiments 1 through 3 of a solid-state image capturing apparatus and a manufacturing method for the solid-state image capturing apparatus according to the present invention that are applied to a CMOS image sensor, and Embodiment 4 of an electronic information device using, as an image capturing section thereof, Embodiment 1 through 3 of the solid-state image capturing apparatus and the manufacturing method for the solid-state image capturing apparatus according to the present invention will be described with reference to the accompanying drawings. In this case, a CCD image sensor as well as a CMOS image sensor can be employed.

Embodiment 1

FIG. 1 is a longitudinal cross-sectional view showing an exemplary essential structure of a solid-state image capturing device according to Embodiment 1 of the present invention.

In a solid-state image capturing device 100 according to Embodiment 1 in FIG. 1, a case is described where the solid-state image capturing device 100 includes a first light receiving section 111 for detecting an electromagnetic wave of a first wavelength band, a second light receiving section 112 for detecting an electromagnetic wave of a second wavelength band, and a third light receiving section 113 for detecting an electromagnetic wave of a third wavelength band, as a plurality of light receiving section. In this case, three colors having different wavelength bands of light are considered to be, for example, three primary colors of R (red), G (green), and B (blue). Hereinafter, a case is described where blue light is detected in the first wavelength band, green light in the second wavelength band, and red light in the third wavelength band respectively.

In FIG. 1, a solid-state image capturing apparatus 10 according to Embodiment 1 is provided with the first light receiving section (light receiving section diffusion layer for blue light) 111 for detecting an electromagnetic wave of a first wavelength band, a second light receiving section (light receiving section diffusion layer for green light) 112 for detecting an electromagnetic wave of a second wavelength band, and a third light receiving section (light receiving section diffusion layer for red light) 113 for detecting an electromagnetic wave of a third wavelength band sequentially laminated on a semiconductor substrate 101 in a depth direction of the semiconductor substrate 101 for the solid-state image capturing device 100 that is a unit pixel section.

Although not shown in FIG. 1, the solid-state image capturing devices 100 are arranged periodically (in two dimensions such as in matrix) in a direction along a plane of the semiconductor substrate 101. In each of the solid-state image capturing devices 100, of all the incident electromagnetic wave, electromagnetic waves having wavelength bands corresponding to the depths of the respective light receiving sections are detected at the light receiving sections in accordance with the wavelength dependency of optical absorption coefficient of the material of the semiconductor substrate 101, and then signal charges are generated. A reverse conducting impurity diffusion layer 121, whose electric polarity is reversed with that of a light receiving section diffusion layer, is provided on the light incident surface on the surface (on the first light receiving section 111) of the semiconductor substrate 101 to suppress occurrence of charges at the surface level.

In each of the solid-state image capturing devices 100, trenches (grooves) having the depth of the light receiving sections are arranged from the opposite surface of the light incident side of the semiconductor substrate 101 such that the light receiving sections and the trenches are adjacent to each other in a plane direction of the substrate at the respective layers of the laminated light receiving sections 111 to 113 (changing their location on the plane view). In FIG. 1, a trench 112a adjacent to the light receiving section 112 and a trench 113a adjacent to the light receiving section 113 are shown, and a trench adjacent to the light receiving section 111 is not shown (trench 111a is not shown), since it is positioned in the interior side of the space (FIG. 1).

An inner wall of each of the trenches 111a-113a is covered with a gate insulation film 141 (thermally oxidized film), and a material (metal material, for example) for a readout gate electrode 151 (shown in FIG. 3) is embedded in each of the trenches 111a-113a. Along the gate insulation film 141 (upper and lower direction in FIG. 1) which covers each of side walls of the trenches 111a-113a described above, a channel diffusion layer 131 (channel region), whose electric polarity is reversed (reverse conducting type) with that of a light receiving section diffusion layer, is provided as a charge transfer path which transfers signal charges from each of the light receiving sections 111-113 to an accumulation diffusion layer.

In addition, impurities for the light receiving section diffusion layer and impurities of a reversed electric characteristic for the channel diffusion layer 131 electrically negate each other, so that a low concentration channel diffusion layer 133 is formed and it is provided in a region where a region for forming each of the light receiving sections 111-113 (regions extending sideways in FIG. 1) and a region for forming each of the trenches 111a-113a (regions extending upper and lower direction in FIG. 1) partially overlap each other (such as a depth part B where a light receiving section 113 and a trench 151 overlap each other).

Further, a reverse conducting diffusion layer 132, whose electric polarity is reversed with that of each of the light receiving section diffusion layers, is provided on the side of the trench from the side of the light radiation surface to the depths of each of the light receiving sections 111-113. The light receiving sections 111-113 adjacent to each other in a direction along a plane of a substrate are electrically isolated from each other by the trenches 111a-113a described above and the reverse conducting diffusion layer 132.

Further, Accumulation diffusion layers 161 are provided, which are adjacent to gate insulation films 141 formed on a side wall of each of the trenches 111a-113a and are separated from each of the light receiving sections 111-113, on the substrate surface side opposite from the light incident side. A predetermined readout voltage is applied to the readout gate electrodes 151, so that signal charges accumulated in the light receiving sections 111-113 are transferred independently to the respective accumulation diffusion layers 161.

In each of the solid-state image capturing devices 100, an amplification transistor 163 and a reset transistor 164 and the like are provided as transistors which configures circuits for selecting a specific solid-state image capturing device 100 among a plurality of solid-state image capturing devices 100 and for outputting the signal from the solid-state image capturing device, the amplification transistor 163 amplifying output in accordance with signal voltage transferred from each of the light receiving sections 111-113 to the accumulation diffusion layers 161 respectively, and the reset transistor 164 resetting the signal voltage at the accumulation diffusion layers 161 functioning as a charge detection section for (signal voltage conversion section) detecting charge-transferred signal charges, to predetermined voltage.

These transistors are formed on the opposite side from the light incident side on the semiconductor substrate 101 in and on each of wells 162 formed by an impurity diffusion layer. Further, wiring layers 191-193 made of a metal material are formed on the opposite side from the light incident side on the semiconductor substrate 101 as transfer paths for signal charges. These wiring layers 191-193 are laminated one above another via interlayer insulation films 181-184 in between, and they are respectively connected to the readout gate electrode 151 and the charge accumulation region 161 as well as the amplification transistor 163 and the reset transistor 164 via via-contacts provided at the interlayer insulation films 181-184.

Therefore, the readout gate electrode 151 and accumulation diffusion layer 161 are electrically connected via respective wiring layers 191 made of a metal material to a signal readout circuit for selecting a pixel from a solid-state image capturing devices 100 each as a pixel section and for outputting a signal from the solid-state image capturing device 100.

With the structure described above, the operation of the solid-state image capturing device 100 will be described below.

With respect to the solid-state image capturing apparatus 10 according to Embodiment 1, first, an incident subject light comes in from the surface side of the semiconductor substrate 101 having the light receiving sections 111-113 formed thereon at the time of image capturing. Of electromagnetic waves of incident subject light, electromagnetic waves having wavelength bands corresponding to the depths of the respective light receiving sections 111-113 are detected at the respective light receiving sections 111-113 in accordance with the wavelength dependency of optical absorption coefficient of a semiconductor substrate material of the semiconductor substrate 101, and signal charges are generated. For example, blue light is detected at the first light receiving section 111, green light at the second light receiving section 112 and red light at the third light receiving section 113. By applying voltage to the readout gate electrode 151, the signal charges detected at respective light receiving sections are read out at the accumulation diffusion layer 161 via the low concentration channel diffusion layer 133 and the channel diffusion layer 131.

First, a method for manufacturing the solid-state image capturing apparatus 10 according to Embodiment 1 is briefly described here.

The method for manufacturing the solid-state image capturing apparatus according to Embodiment 1 includes: a light receiving section forming step of forming respective diffusion layers in a depth direction of the semiconductor substrate 101 for the first light receiving section 111 to the Nth light receiving section (the third light receiving section 113 in this case) in this order, the diffusion layers being extended from their overlapping point along with the sides of a substrate plane (length for the square) to have parts for respective layers not overlapping with each other in the plane view; a reverse conducting diffusion layer forming step of forming reverse conducting diffusion layers on a substrate surface of a light incident side, whose electric polarity is different from that of the light receiving sections 111-113; a trench forming step of forming trenches 111a-113a, the trench having a depth that reaches from the opposite substrate surface from the light incident side to the light receiving sections 111-113 and arranged adjacent to the sides of the substrate in a different direction along a plane of the substrate depending on each of the laminated light receiving sections 111-113, a trench side diffusion layer forming step of forming reverse conducting diffusion layers 131-133, whose electric polarities are different from those of the respective light receiving sections 111-113, on the sides of the trenches 111a-113a; a gate insulation film forming step of forming a gate insulation film 141, so that it covers the inner wall of each of the trenches 111a-113a; a gate electrode forming step of filling the trenches 111a-113a to form readout gate electrodes 151-153; and an accumulation diffusion layer forming step of forming an accumulation diffusion layer 161 which is adjacent to the gate insulation film 141 on the substrate surface opposite from the light incident side and is separated from each of the light receiving sections 111-113.

In this manner, a predetermined impurity is implanted into the inner wall of the common gaps (trenches 111a-113a) to form a silicon oxide film (or a high dielectric from CVD; hafnium oxide: $HfO_2$/HfSiO, voltage is efficiently applied to a channel even when the same drive voltage is applied), and the inside the inner wall is filled with doped silicon (or a metal material) to form readout gate electrodes 151-153.

The method for manufacturing the solid-state image capturing apparatus according to Embodiment 1 described above is described in further detail with reference to FIGS. 2-8.

Figure 2:
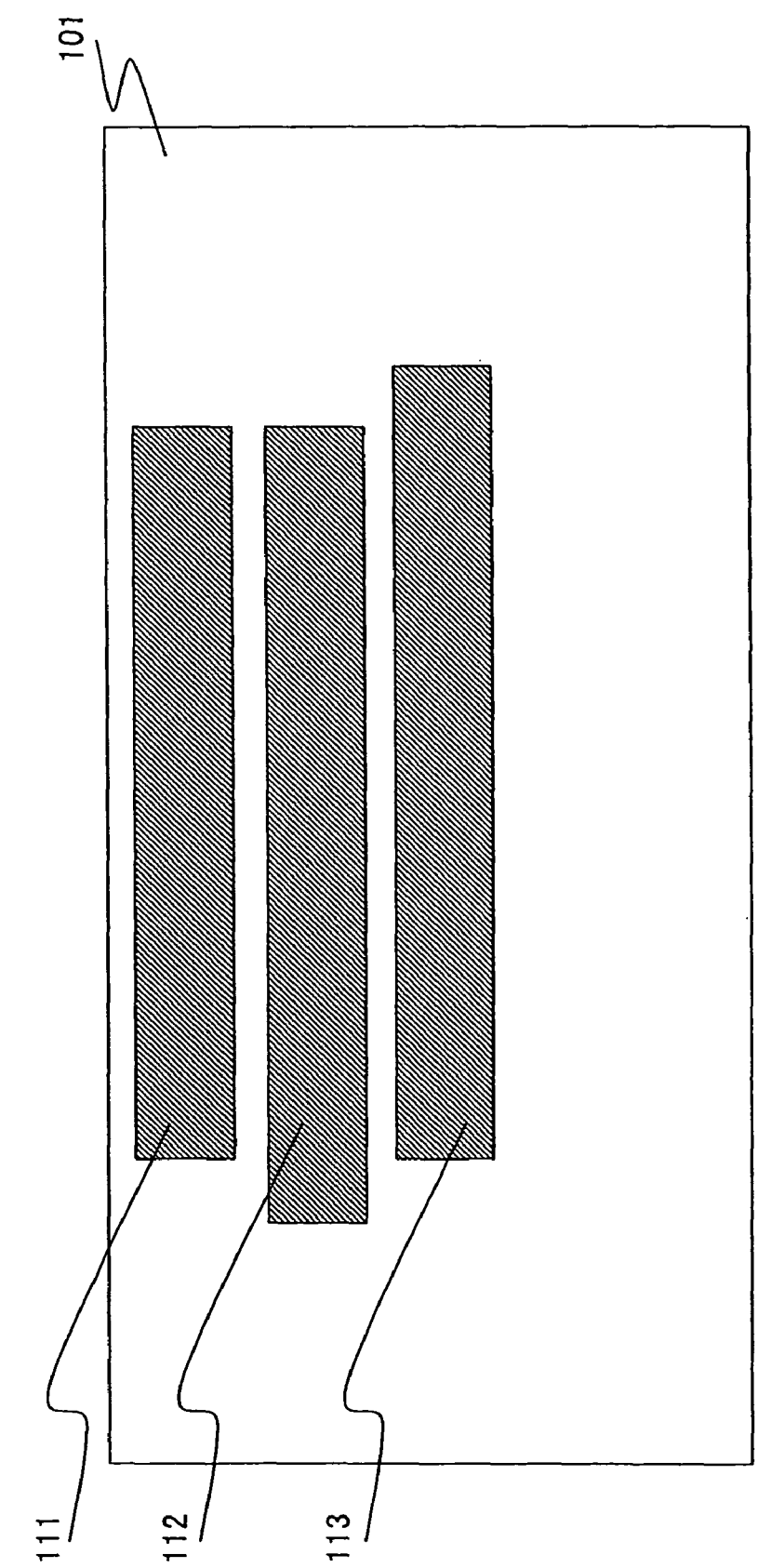
FIG. 2 is a longitudinal cross-sectional view showing an essential structure for describing a step of manufacturing the solid-state image capturing apparatus shown in FIG. 1.
Figure 3:
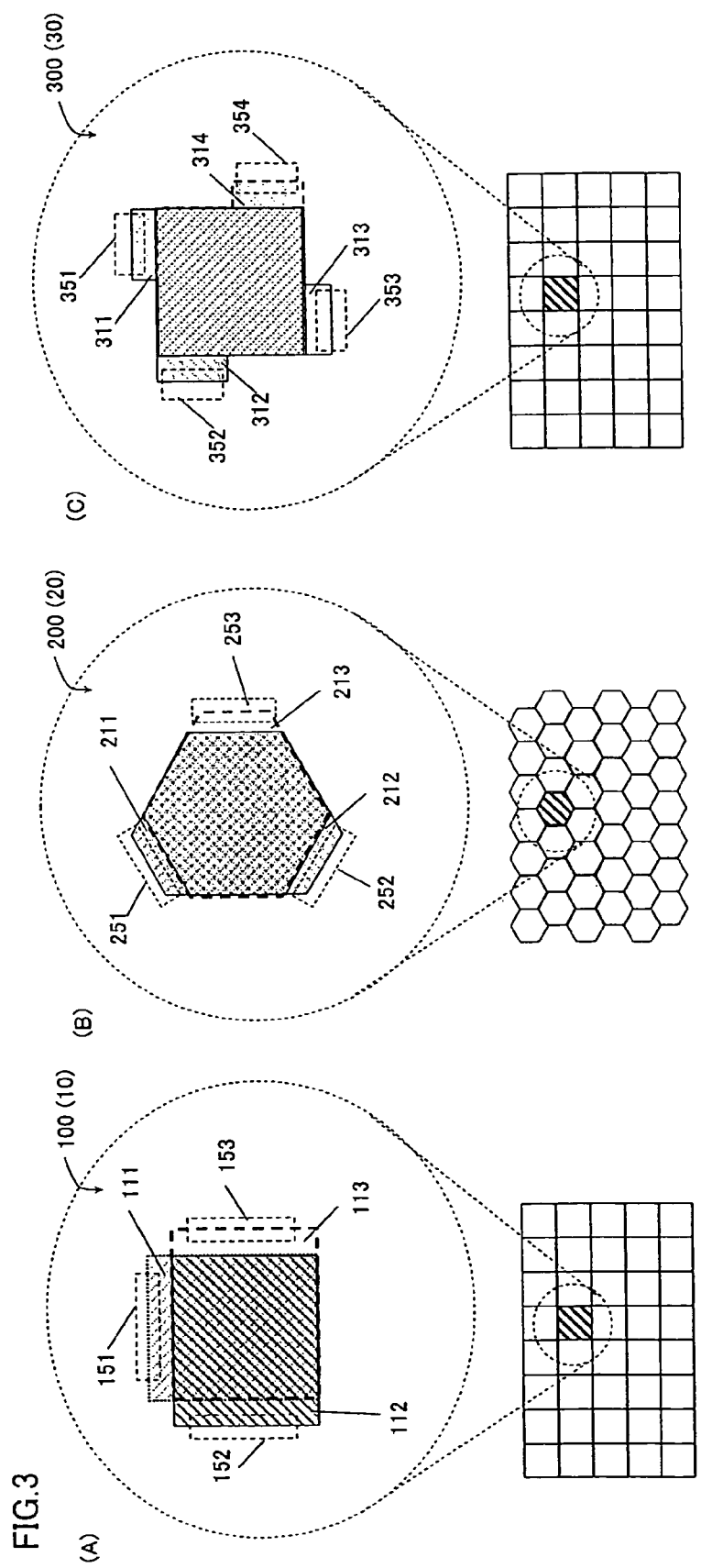
FIG. 3(A) is a plane view showing an exemplary essential structure of an image capturing region of the solid-state image capturing apparatus arranged in such a way that the light receiving sections are extended in three different directions for respective colors in the case where the pixel sections are arranged in a square lattice shape as the solid state image capturing device in FIG. 1.
FIG. 3(B) is a plane view showing an exemplary essential structure of an image capturing region of the solid-state image capturing apparatus arranged in such a way that the light receiving sections are extended in three different directions in the case where the pixel sections are arranged in a hexagon shape in a honeycomb structure as the solid state image capturing device in Embodiment 2.
FIG. 3(C) is a plane view showing an exemplary essential structure of an image capturing region of the solid-state image capturing apparatus arranged in such a way that the light receiving sections are extended in four different directions for respective colors in the case where pixel sections are arranged in a square lattice shape as the solid state image capturing device in Embodiment 3.

FIG. 2 and FIGS. 4-8 each are longitudinal cross-sectional view of an essential structure for describing a step of manufacturing the solid-state image capturing apparatus according to Embodiment 1, and FIG. 3 is a plane view showing an exemplary pixel section arrangement and a plane view formation of the pixel section.

As shown in FIG. 2, in order to form desired light receiving section diffusion layers for respective colors at desired depths, after opening a resist (not shown) using a photo-lithography technique to open a region for forming the first light receiving section diffusion layer 111 which detects blue light, an impurity is implanted using an ion implantation technique. Then, the resist is removed to form the first light receiving section diffusion layer 111 as the upper most layer, which detects blue light. Subsequently in the similar manner, the photo-lithography steps, ion implantation steps and resist removal steps are repeatedly performed, so that the second light receiving section diffusion layer 112 as the middle layer, which detects green light, and the third light receiving section diffusion layer 113 as the lower most layer, which detects red light, are sequentially formed.

With semiconductor junction (PN junction) of the diffusion layers of the light receiving sections 111-113 and the semiconductor substrate 101 with a different electric polarity, a photodiode (light receiving section) is configured as a photoelectric conversion section. The semiconductor substrate 101 can be a silicon substrate having an epitaxial layer formed in part or entirely, and the photodiode (light receiving section) can be formed in the epitaxial layer. In this case, noise component of the signal charges can be reduced, which results in an improved image quality.

As each of the light receiving sections, the first light receiving section 111, which detects blue light, is located between above or equal to 0.1 µm and below or equal to 0.4 µm from the light incident side surface of the semiconductor substrate 101; the second light receiving section 112, which detects green light, is located between above or equal to 0.4 µm and below or equal to 0.8 µm from the light incident side surface of the semiconductor substrate 101; and the third light receiving section 113, which detects red light, is located between above or equal to 0.8 µm and below or equal to 2.5 µm from the light incident side surface of the semiconductor substrate 101. In this manner, the first light receiving section 111 to the third light receiving section 113 are arranged, so that it is possible that all the signals of the three primary colors (R, G and B) are detected more accurately within one pixel section.

However, the depths of the light receiving sections 111-113 are appropriately set in accordance with detected wavelength bands and the optical absorption coefficient of semiconductor materials, and therefore, the depth ranges described above are merely general values and the depth ranges are not limited to these values.

The light receiving sections 111-113 described above are formed such that each layer of the light receiving sections is extended towards different directions from the others along a plane of a substrate. In FIG. 2, for example, the light receiving section 113 at the lowest layer is extended to the right side, the light receiving section at the middle layer is extended to the left side, and the light receiving section 111 at the upper most layer is, although not shown, provided being extended either to the front side or to the back side. Further, explaining with a plane view as shown in FIG. 3 (A), the light receiving sections 111-113 each are formed such that respective sides of the light receiving sections are extended towards different substrate plane directions for pixel sections where the light receiving sections 111-113 are arranged in a square or rectangle lattice shape. Thus, the regions that form the light receiving sections 111-113 each are arranged to be extended towards different directions, and the trenches are arranged at three different directions such that they are adjacent to the corresponding extended sides of the light receiving sections 111-113. As a result, though described later, it is possible that readout gate electrodes 151-153 and the respective light receiving sections 111-113 are placed independently adjacent to each other for corresponding colors, thereby being capable of reading out different color signals separately.

Figure 4:
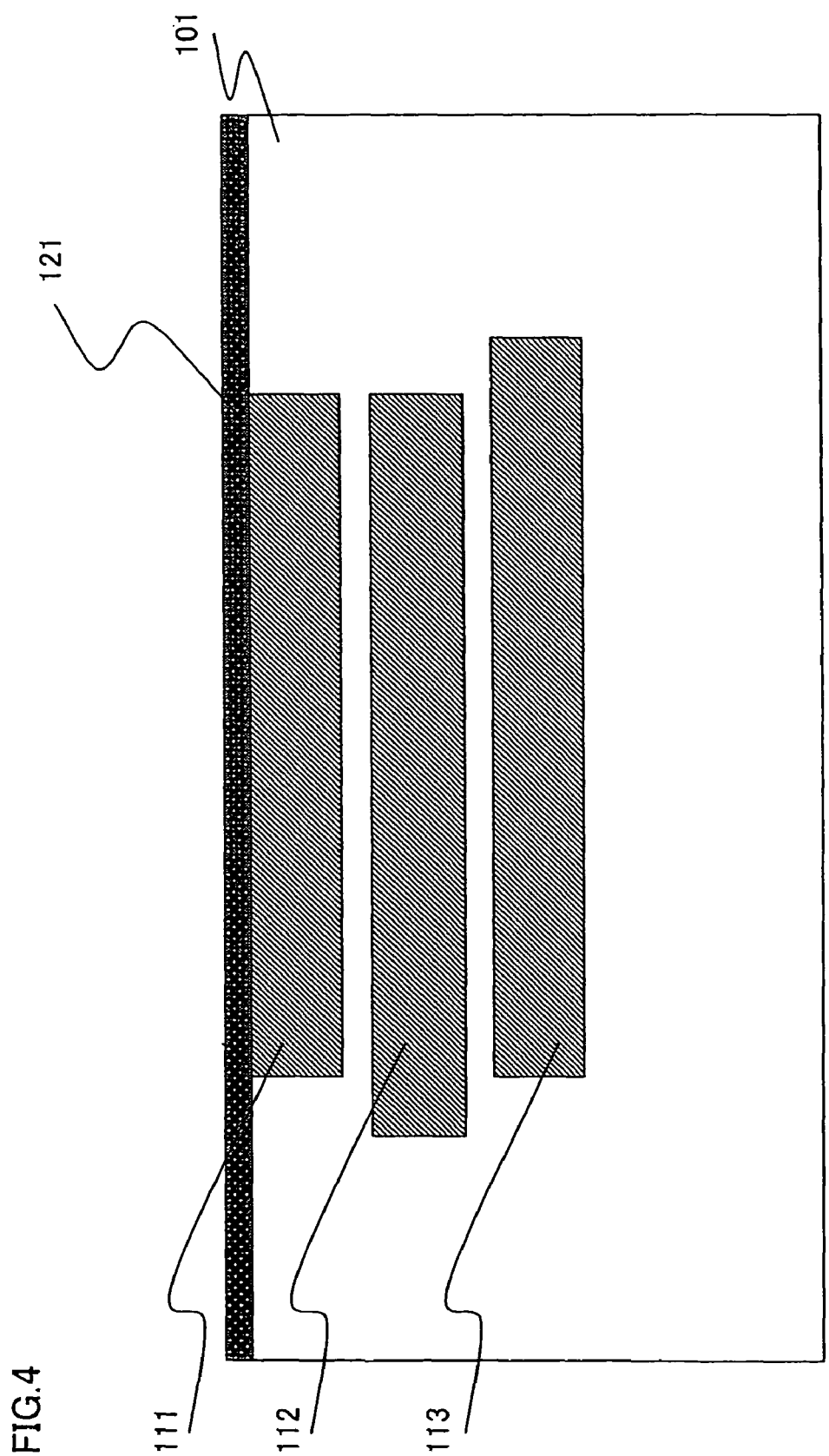
FIG. 4 is a longitudinal cross-sectional view showing an essential structure for describing a step of manufacturing the solid-state image capturing apparatus shown in FIG. 1.

Subsequently, as shown in FIG. 4, ion implantation is performed on the entire surface of the semiconductor substrate 101, and a reverse conducting diffusion layer 121, whose electric polarity is different from that of the light receiving section 111, is formed. Forming the reverse conducting diffusion layer 121 will prevent a depletion layer extending from a diffusion layer of the first light receiving section 111 from reaching a surface section of the semiconductor substrate 101, enabling to control dark voltage noise due to electric charge generated at an interface state of the substrate surface and improve an image quality.

Figure 5:
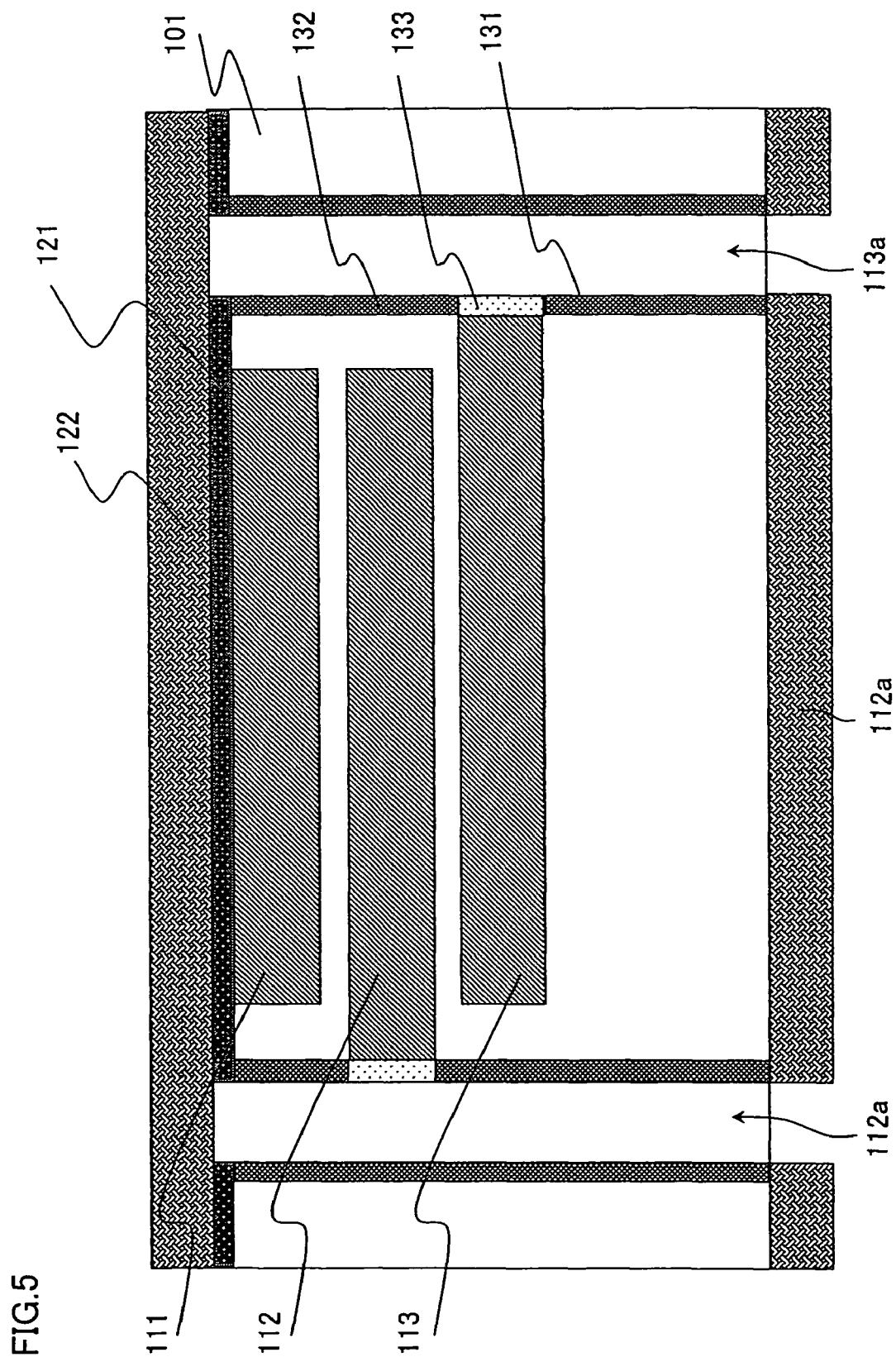
FIG. 5 is a longitudinal cross-sectional view showing an essential structure for describing a step of manufacturing the solid-state image capturing apparatus shown in FIG. 1.

Subsequently, as shown in FIG. 5, after an insulation layer 122 such as a silicon oxide film and a nitride film is formed by a technique such as CVD, a resist (not shown) is also opened by a photo-lithography technique in a region of a surface of the substrate opposite from the light incident surface, in which a readout gate electrode will be formed. After removing the resist by etching of the insulation film 122 by an etching technique, etching for the semiconductor substrate 101 is performed until it reaches the depths of the first light receiving section 111 to the third light receiving section 113 respectively, thereby forming the trenches 111a-113a (the trench 111a is not shown). In this case, the trenches are positioned in such a way that they overlap with the regions for forming the first light receiving section 111 to the third light receiving section 113, in which the first light receiving section 111 to the third light receiving section 113 are formed by being extended to different substrate plane directions from each other as described above.

Further, as shown in FIG. 5, annealing is performed under an atmosphere of a material gas of a conductive impurity, whose electric polarity is reversed from that of a diffusion layer of light receiving sections 111-113. Thus, although diffusion of an impurity on the semiconductor substrate 101 is prevented by the insulation layer 122, gaseous diffusion occurs from the trench side, and therefore a channel diffusion layer 131 is formed only on the trench side, the channel diffusion layer 131 having a different electric polarity from that of the first light receiving section 111 to the third light receiving section 113. At this time, an impurity is diffused on the trench side with the depth up to and including the first light receiving section 111 to the third light receiving section 113, and a reverse conducting diffusion layer 132 is simultaneously formed. Thus, it is possible to prevent the depletion layer from being extended from the first light receiving section 111—the third light receiving section 113 to the trench interface, enabling to control dark voltage noise due to electric charge generated at interface states of the trench surfaces and improve an image quality. In addition, a low concentration channel diffusion layer 133 is self-alignin[g]ly formed at locations where the regions for forming the first light receiving section 111 to the third light receiving section 113 and the trenches overlap each other, in which the first light receiving section 111 to the third light receiving section 113 are formed by being extended to different substrate plane directions from each other as described above. Thus, at the depths corresponding to the first light receiving section 111 to the third light receiving section 113, readout gate voltage necessary for complete depletion becomes lower, thereby enabling reading out at low voltage. Further, because the first light receiving section 111 to the third light receiving section 113 do not come in direct contact with the trench side, it enables to control dark voltage noise due to electric charge generated at interface states of the trench surfaces and improve an image quality.

Figure 6:
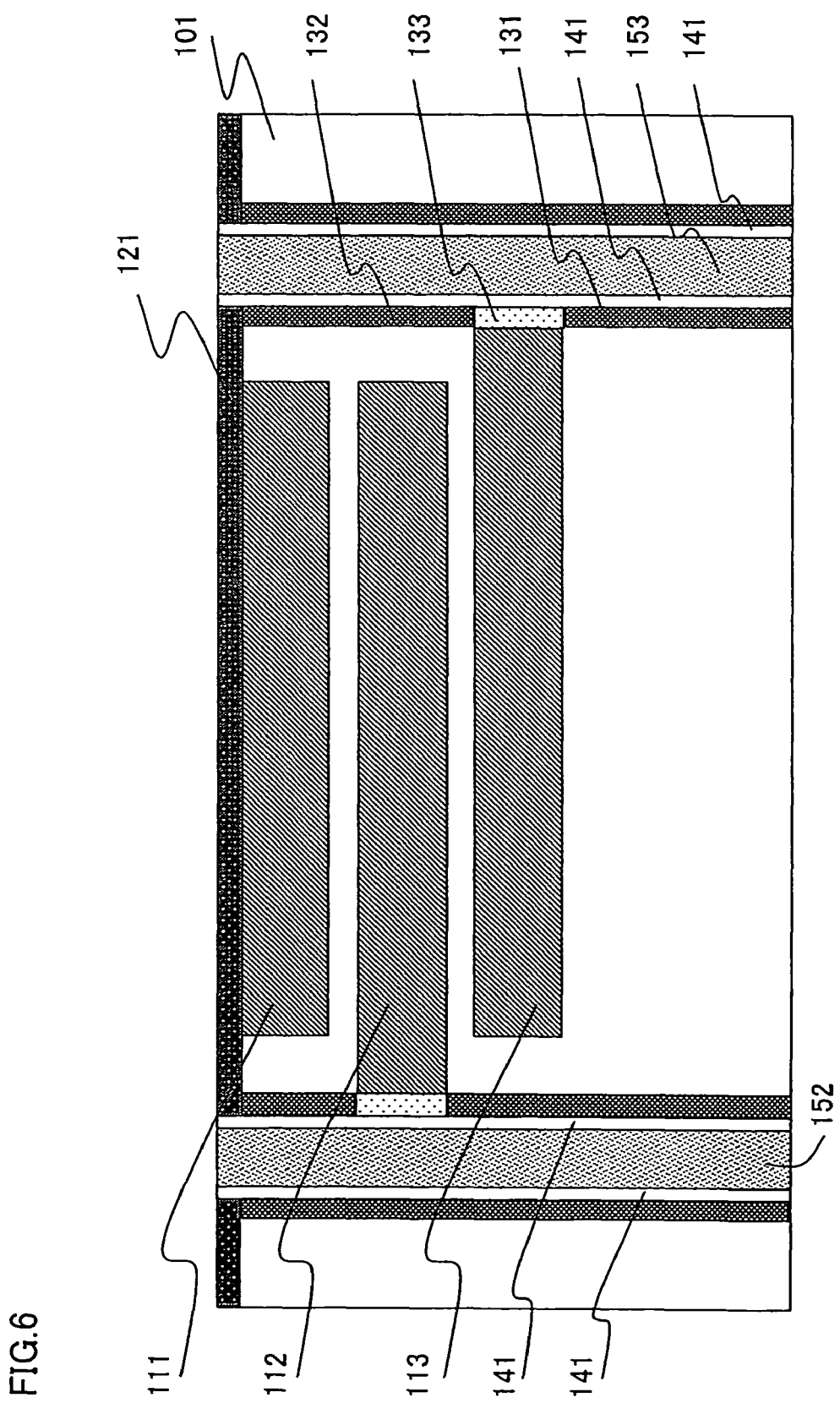
FIG. 6 is a longitudinal cross-sectional view showing an essential structure for describing a step of manufacturing the solid-state image capturing apparatus shown in FIG. 1.

Subsequently, as shown in FIG. 6, after removing the insulation layer 122 on both of the surfaces of the semiconductor substrate 101, a gate insulation film 141 is formed in such away as to cover side walls (inner walls) inside the trenches 111a-113a by thermal oxidation, for example. After filling inside the trenches 111a-113a by vapor-grown phosphorus doped polysilicon, for example, as gate electrode material, unnecessary gate electrode material formed on the substrate surface is removed by etching the entire surface of the semiconductor substrate 101 to form gate electrodes 151-153. Here, every readout gate electrodes 151-153 are considered to be provided maintaining to be insulated from each other.

Figure 7:
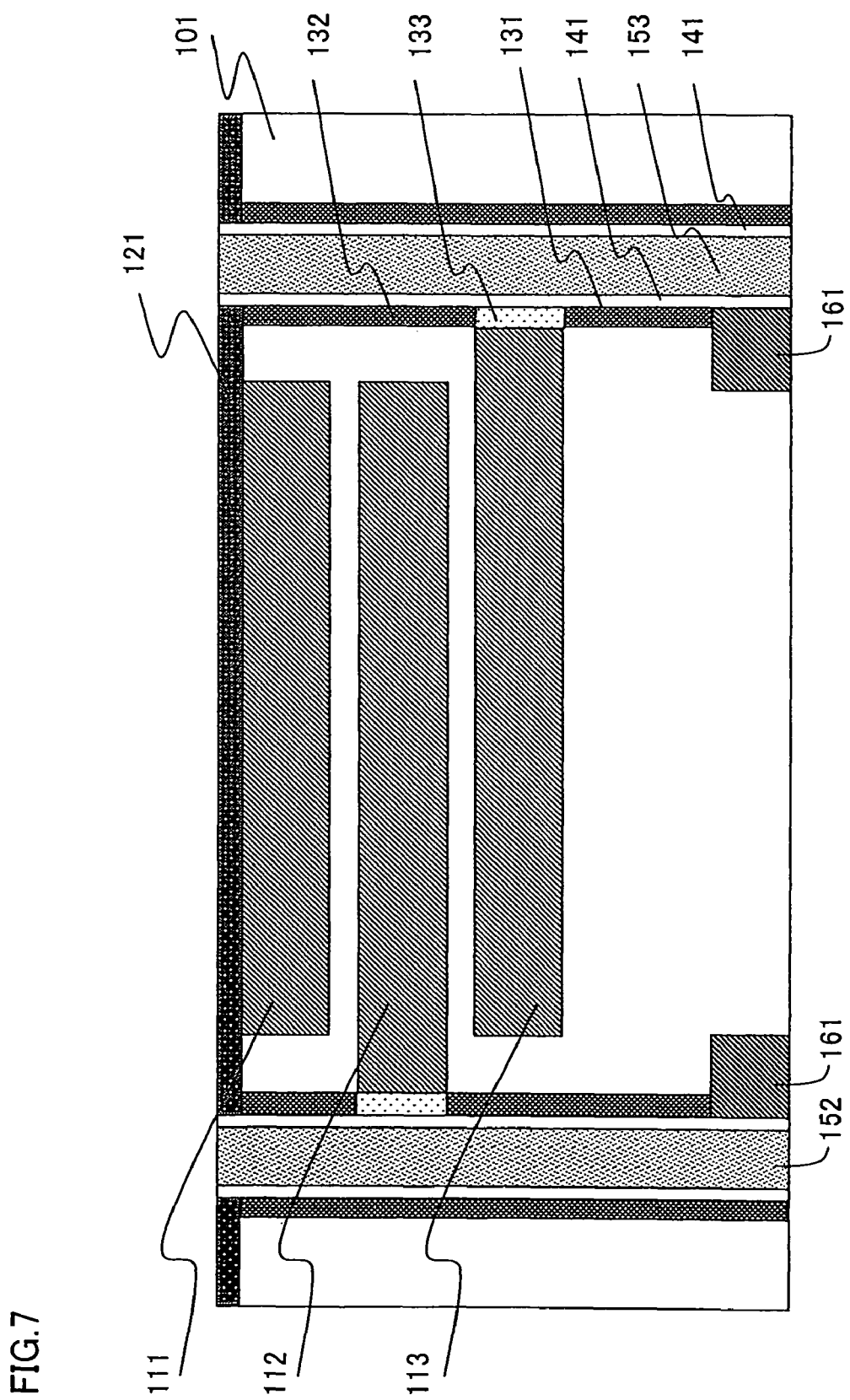
FIG. 7 is a longitudinal cross-sectional view showing an essential structure for describing a step of manufacturing the solid-state image capturing apparatus shown in FIG. 1.

Next, as shown in FIG. 7, after a resist (not shown) is opened by a photo-lithography technique on the substrate surface opposite from the light incident surface, an impurity having the same electric polarity as that of the light receiving sections 111-113 is implanted using an ion implantation technique, and in turn the resist is removed to form accumulation diffusion layers 161. Here, the accumulation diffusion layers 161 need to be formed in such a way that they are adjacent to the gate insulation films 141 on the trench side described above but apart from the light receiving sections 111-113. Further, the impurity concentration of the accumulation diffusion layers 161 need to be set higher than that of the light receiving sections 111-113. As a result, in Embodiment 1, when voltage is applied to the readout gate electrodes 151-153, signal charges generated in the light receiving sections 111-113 can be read out at the accumulation diffusion layers 161 formed on the semiconductor substrate, via channel diffusion layers 131 formed on the trench side walls.

Figure 8:
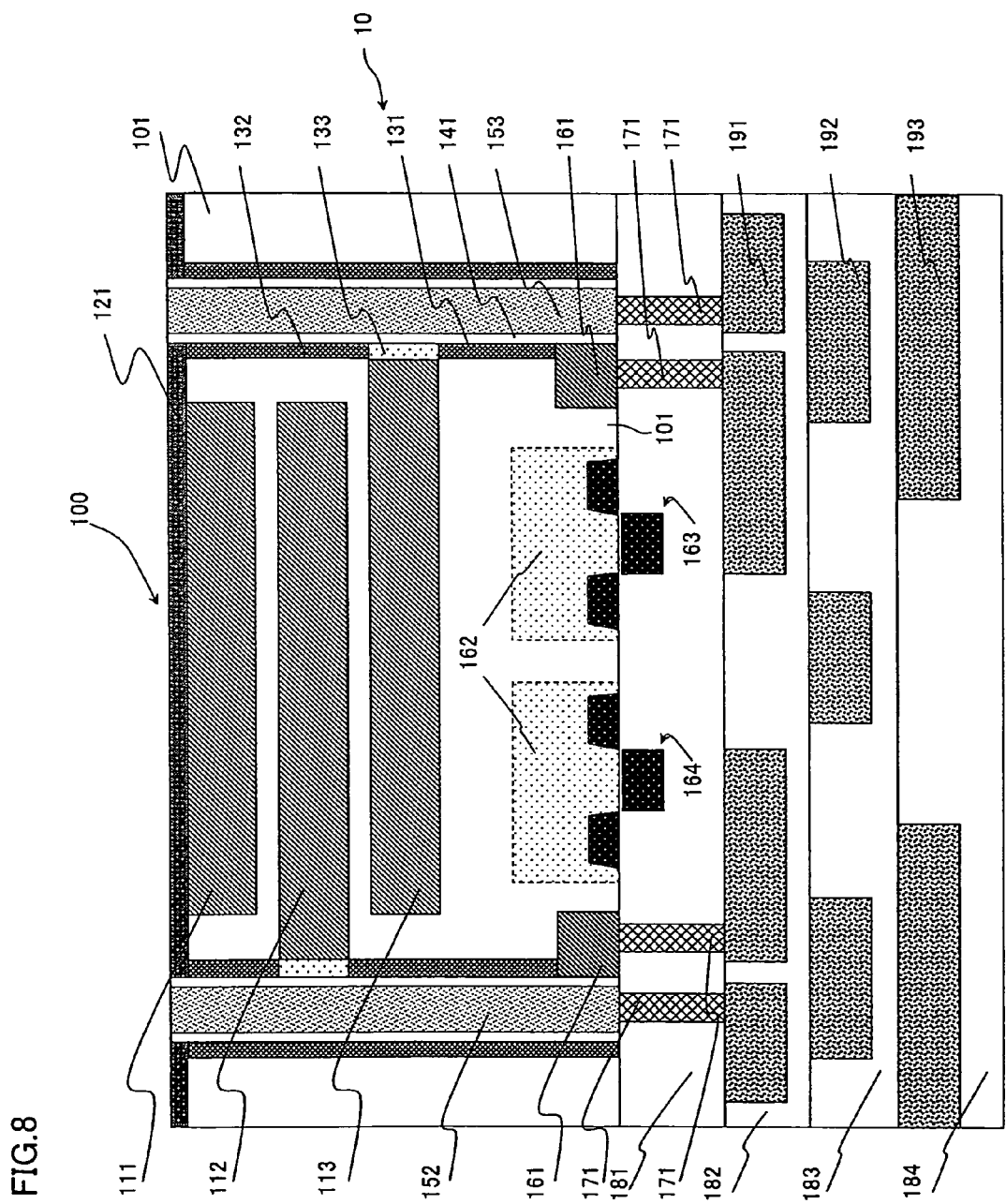
FIG. 8 is a longitudinal cross-sectional view showing an essential structure for describing a step of manufacturing the solid-state image capturing apparatus shown in FIG. 1.

Further, as shown in FIG. 8, after forming a plurality of wells 162 on the opposite side from the light incident surface side of the light receiving sections 111-113 by a known photo-lithography technique and ion implantation technique, a plurality of transistors, such as an amplification transistor 163 for amplifying in response to signal voltage that has converted signal charges at respective accumulation diffusion layers 161 and a reset transistor 164 for resetting respective accumulation diffusion layers 161 to predetermined voltage, are formed as a signal readout circuit related to signal output by a known technique on the substrate surface opposite from the light incident surface. In FIG. 8, every transistor in the signal readout circuit is provided inside the well 162 or on the well. Subsequently, interlayer insulation films 181-184 for insulating in between wirings, wiring layers 191-193 as transfer paths for signal charges, and via contacts 171 are formed on the surface of the semiconductor substrate 101 opposite from the light incident surface side by a known technique, and the accumulation diffusion layers 161 are connected to amplification transistor 163 and reset transistor 164 via the wiring layers 191-193, thereby connecting readout gate electrodes 151-153 and pixel selection circuit (not shown).

As described above, the solid-state image capturing apparatus 10 according to Embodiment 1 shown in FIG. 1 is provided.

Figure 9:
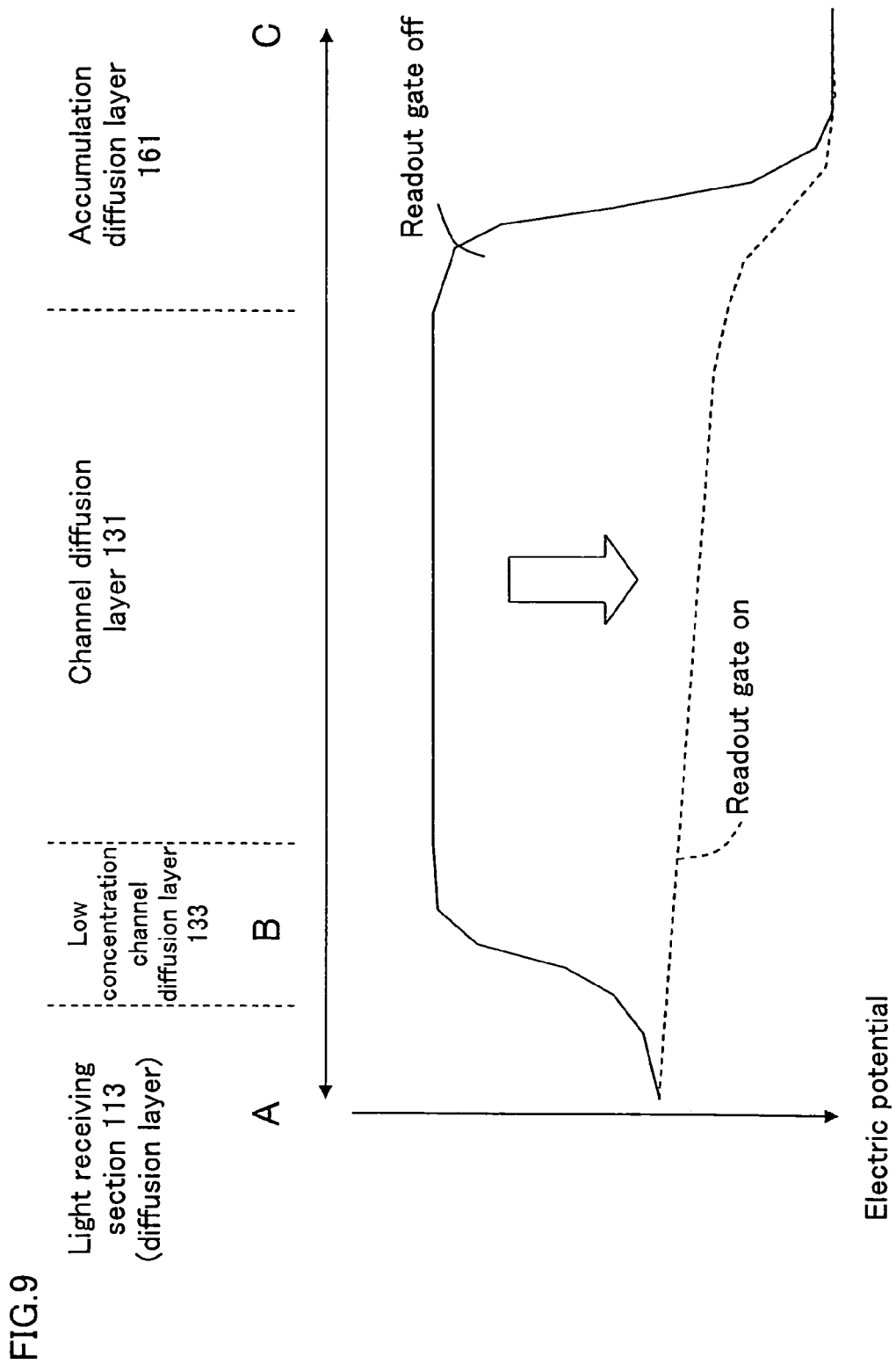
FIG. 9 is a view showing a potential distribution in an electric charge transfer path shown as A-B-C in FIG.

FIG. 9 is a potential distribution chart schematically showing a potential distribution in the charge transfer paths for signal charges shown as A-B-C in FIG. 1.

As shown with a solid line in FIG. 9, when readout voltage is not applied to a readout gate electrode 153, signal charges will not flow out of alight receiving section 113 side since potentials of a channel diffusion layer 131 and a low concentration channel diffusion layer 133 are higher than that of the diffusion layer of the light receiving section 113.

Alternatively, as shown with a dotted line in FIG. 9, when signal voltage is applied to the readout gate electrode 153, since the potentials of the channel diffusion layer 131 and a low concentration channel diffusion layer 133 are lower than that of the light receiving section 113, the signal charges accumulated in the light receiving section 113 will flow out and will be read out at the accumulation diffusion layers 161 as a signal charge detection section.

Here in regard to signal charges of different colors accumulated in the diffusion layers of the light receiving sections 111 and 112, the trench is apart from these receiving sections 111 and 112 and therefore the signal charges will not flow out. Thus, signal charges corresponding to respective colors can be independently read out.

As described above in accordance with Embodiment 1, the solid-state image capturing apparatus 10 with high sensitivity and high resolution can be realized, which needs no color filter and is capable of reading out signal charges corresponding to a plurality of colors separately with low voltage.

In addition, although not explained in Embodiment 1 described above, trenches 111a-113a are provided reaching the positions where the light receiving sections 111-113 do not overlap with each other in a plane view from the substrate surface opposite from the light incident surface of the semiconductor substrate 101; readout gate electrodes 151-153 are provided to the respective trenches 111a-113a; and electric charge transfer sections are provided at the time of driving the readout gate electrodes 151-153, the electric charge transfer sections being capable of transferring charges independently from a plurality of the light receiving section 111-113 via side wall portions of the respective trenches 111a-113a to the substrate surface side opposite from the light incident surface. This electric charge transfer sections are positioned in such a way that the trenches 111a-113a will be adjacent to each layer of laminated light receiving sections 111-113 in different substrate plane directions respectively, and the inner walls of the trenches 111a-113a are covered with the gate insulation films 141 to embed readout gate electrode material in each of the trenches 111a-113a. As a result, the objective of the present invention to obtain a solid-state image capturing apparatus with high sensitivity and high resolution, which needs no color filter and is capable of reading out signal charges corresponding to a plurality of colors separately with low voltage, is achieved.

Embodiment 2

In Embodiment 1 described above as shown in FIG. 3(A), where the light receiving sections 111-113 are arranged in a square or rectangle lattice shape, the three layered light receiving sections 111-113 each are formed such that respective sides of the light receiving sections are extended towards different substrate plane directions from the center (the sides of the light receiving sections are extended towards the periphery in such a way that the light receiving sections each will not overlap in a plane view). In Embodiment 2, as shown in FIG. 3(B), a case is described where each of the pixel sections is arranged in a hexagon shape in a plane view and the plurality of the pixel sections are arranged in a honeycomb structure (beehive structure), in which each of the pixel sections is shifted by a half period in the honeycomb structure, and three layers of the light receiving sections 211-213 are formed in such a way that each of the edges of the respective light receiving sections, which is in a different substrate plane direction, is extended to a direction away from the center (the regions of the light receiving sections are extended together with the respective edges so that the light receiving sections 211-213 will not overlap in a plane view).

The light receiving sections 211-213 each have a hexagon shape and are arranged in a honeycomb structure. The light receiving sections 211-213 overlap each other in a plane view, each of which has an edge being extended towards outside in such a way that the side does not overlap with other edges in a plane view, and readout electrodes 251a-253a are arranged in such a way that each of them are arranged at three different locations along each one of the extended edges to be adjacent to them.

Thus, in the case where a pixel section has a hexagon shape, a solid-state image capturing device 200 according to Embodiment 2 forms the light receiving sections 211-213 in such a way that they each have an edge being extended towards outside together on its light receiving region in a different planar direction with the substrate. Trenches in this case are arranged at three different locations in such a way that they are adjacent to the extended edges of the light receiving sections 211-213 (every other edge of the hexagon). With this structure, the trench sections, which will be readout gate electrodes for the transfer transistor (electric charge transfer section), are arranged at each edge of the respective pixel sections (the light receiving sections 211-213) in such a way that the trench sections do not overlap with each other in a plane view. As a result, all six edges in the periphery of one pixel section having a hexagon shape are surrounded by the trench sections including adjoining solid-state image capturing device 200 that will be the readout gate electrodes. Therefore, it is possible to separate pixels using the trench sections, resulting in a much smaller area for placing a unit pixel section and even higher resolution. Consequently, besides this solid-state image capturing device 200, a solid-state image capturing apparatus 20 having a signal readout circuit is configured.

In Embodiment 2, a case has been described where the light receiving sections 211-213 each have a hexagon shape and are arranged in a honeycomb structure and the light receiving sections 211-213 overlap each other in a plane view, each of which has an edge being extended towards outside in such a way that the extended edge does not overlap with other extended edges in a plane view, and readout electrodes 251a-253a are arranged in such a way that each of them are arranged at three different locations along each one of the extended edges to be adjacent to them. However, the present invention is not limited to this structure, but it can have a structure where the light receiving sections 211-213 overlap each other in a plane view, each of which has an edge being extended towards outside in such a way that the extended edge does not overlap with other extended edges in a plane view, and readout electrodes 251a-253a are arranged in such a way that each of them are arranged at two different locations along each one of the extended edges to be adjacent to them.

Embodiment 3

In Embodiment 1 described above, the solid-state image capturing device 10 laminated with three layers of the light receiving sections 111-113 to detect three primary colors of R, G and B. In Embodiment 3, a case is described where a solid-state image capturing apparatus has a solid-state image capturing device, whose light receiving sections are laminated with four layers to detect four colors.

In Embodiment 3, there are N (N is a natural number) numbers of light receiving sections provided in a depth direction of a semiconductor substrate, the light receiving sections being from the first light receiving section for detecting an electromagnetic wave of a first wavelength band to the Nth light receiving section for detecting an electromagnetic wave of an Nth wavelength band. A case is provided here where the plural number of Nth layers is four layers. In such a case as this, four layers (four colors) of light receiving sections, such as a first light receiving section for detecting an electromag-netic wave of a first wavelength band, a second light receiving section for detecting an electromagnetic wave of a second wavelength band, and a third light receiving section for detecting an electromagnetic wave of a third wavelength band, and a fourth light receiving section for detecting an electromagnetic wave of a fourth wavelength band, can also be laminated similarly as Embodiment 1 described above.

As each of the light receiving sections, the first light receiving section, which detects blue light, is located between above or equal to 0.1 µm and below or equal to 0.4 µm from the light incident side surface of the semiconductor substrate; the second light receiving section, which detects emerald light, is located between above or equal to 0.3 µm and below or equal to 0.6 µm from the light incident side surface of the semiconductor substrate; the third light receiving section, which detects green light, is located between above or equal to 0.4 µm and below or equal to 0.8 µm from the light incident side surface of the semiconductor substrate; and the fourth light receiving section, which detects red light, is located between above or equal to 0.8 µm and below or equal to 2.5 µm from the light incident side surface of the semiconductor substrate. In this manner, the first light receiving section to the fourth light receiving section are arranged, so that it is possible that all the signals of the three primary colors as well as emerald color are detected more accurately within one pixel section. As a result, it is possible to obtain an image having clear sky and ocean therein. In addition, a light receiving section which detects skin color light may be provided instead of the light receiving section which detects emerald light in order to obtain a clear skin color in an appropriate depth location of the semiconductor substrate. However, note that the depths of the light receiving sections are appropriately set in accordance with detected wavelength bands and the optical absorption coefficient of semiconductor materials, and therefore, the depth ranges described above are merely general values and not limited to these values.

In addition, for the arrangement of the trench sections with respect to a solid-state image capturing device 300 according to Embodiment 3, as shown in FIG. 3(C), for example, each of light receiving sections 311-314 at every one pixel section is formed in a plurality of pixel sections arranged with a square or rectangle lattice shape in a plane view in such a way that a portion (an edge portion that is shorter than half a length of one edge, for example) is extended from the edges to their respective extended directions (so that the extended portions do not overlap with other portions). In this manner, the regions for forming the first light receiving section 311 to the fourth light receiving section 314 are extended and arranged towards outside in different directions from each other (at four edges), and trench sections 351-354 are arranged at respective four different directions (direction along each edge) in such a way that they are adjacent to the extended region edges (edges of a quadrilateral), so that it is possible that color signals of the four different colors are read out separately in a quite similar manner as the case with three primary colors.

Because all the four sides of the square, which is the periphery of the pixel section, is surrounded by the trench sections 351-354 that will be readout gate electrodes also in this case, it is possible to separate pixels using the trench sections 351-354, resulting in a much smaller area for placing a unit pixel section and even higher resolution.

According to Embodiments 1-3 described above, solid-state image capturing devices, which have N number of layers of light receiving sections laminated at the depths corresponding to the wavelength dependency of optical absorption coefficient of incident light in a depth direction of the semiconductor substrate 101, are arranged in two dimension and sequence in a substrate plane direction and they have predetermined depths to reach to each of the light receiving sections, and trench sections are provided in such a way that the trench sections each are adjacent to respective light receiving sections in respective substrate planer directions. An inner wall of each of the trench sections is covered with a gate insulation film 141; and a material for a readout gate electrode is embedded in each of the trench sections; and an accumulation diffusion layer 161 is provided in such away that it is adjacent to a trench section on the substrate surface opposite from the light incident side and it is separated from each of the light receiving sections. Therefore, it is possible to obtain a solid-state image capturing apparatus having a high sensitivity and high resolution which needs no color filter and is capable of reading out signal charges corresponding to a plurality of colors separately with lower voltage.

Note that the light receiving sections each may have two vertical layers, so that the depth from the light incident side surface to the first light receiving section detects white light in the range of greater or equal to 0.2 µm and below or equal to 2.0 µm as the thickness of a depletion layer and the depth from the light incident side surface to the second light receiving section detects infrared light in the range of 3.0 µm±0.3 µm. In addition, as another case for the two vertical layers of the light receiving sections, it may be arranged in such a manner that the depth from the light incident side surface to the first light receiving section detects ultraviolet light in the range of greater or equal to 0.1 µm and below or equal to 0.2 µm and the depth from the light incident side surface to the second light receiving section detects white light in the range of greater or equal to 0.2 µm and below or equal to 2.0 µm as the thickness of a depletion layer. Further, it may be arranged in such a manner that the depth from the light incident side surface to the first light receiving section detects ultraviolet light in the range of greater or equal to 0.1 µm and below or equal to 0.2 µm and the depth from the light incident side surface to the second light receiving section detects infrared light in the range of 3.0 µm±0.3 µm. In such a case, it may be arranged in such a manner that any light receiving section that is set for a light receiving section depth corresponding to a color of light desired to be accurately expressed is added instead of the first light receiving section.

Embodiment 4

Embodiment 4 describes an electronic information device having, for example, a digital camera (e.g., digital video camera, digital still camera), an image input camera (e.g., monitoring camera, door intercom camera, car-mounted camera such as a car-mounted backside monitoring camera, camera for television telephone and camera for cell phone), and an image input device (e.g., scanner, facsimile and cell phone device equipped with camera) using a solid-state image capturing apparatus including any one of a solid-state image capturing devices 100 to 300 according to Embodiments 1 to 3, which performs photoelectric conversion for image light and captures an image.

The electronic information device according to Embodiment 4 includes at least one of: a memory section (e.g., recording media) for data-recording a high-quality image data obtained by using the solid-state image capturing device according to Embodiments 1 to 3 of the present invention for the image capturing section after a predetermined signal process is performed on the image dada for recording; a display section (e.g., liquid crystal display device) for displaying this image data on a display screen (e.g., liquid crystal display screen) after a predetermined signal process is performed on the image data for display; a communication section (e.g., transmitting and receiving device) for communicating this image data after a predetermined signal process is performed on the image data for communication; and an image output section for printing (typing out) and outputting (printing out) this image data.

As described above according to Embodiment 4 with respect to the electronic information device (e.g., digital camera, variety of image input cameras, and cell phone device equipped with camera), it is possible to realize a high-performance electronic information device including a solid-state image capturing apparatus having a high sensitivity and high resolution which needs no color filter and is capable of reading out signal charges corresponding to a plurality of colors with lower voltage separately.

In Embodiments 1-3, the present invention is exemplified with respect to the applications for a CMOS image sensor. However, the present invention is not limited to this, but the present invention may be applied in a case with a CCD image sensor, which reads out signal charges at a vertical transfer section, transfers them vertically, and further performs signal detection at a signal detection section via a horizontal transfer section. The present invention may be applied as long as the vertical transfer section and the horizontal transfer section are provided opposite from the light receiving section side.

Further, in Embodiment 1 described above, a case has been described where accumulation diffusion layers 161 are provided in such a way as to be adjacent to gate insulation films 141 on a substrate surface opposite from a light incident surface and be separated from light receiving sections 111-113; a channel region 131 is provided in a reverse conducting diffusion layer to transfer signal charges from the light receiving sections 111-113 to the accumulation diffusion layers 161; and solid-state image capturing devices adjacent to each other in a direction along the substrate surface are electrically separated from each other as an individual device by a reverse conducting diffusion layer 132 provided on a side surface of trenches 111a-113a with the depth from the substrate surface side on the opposite side to each of the plurality of the light receiving sections 111-113. However, the present invention is not limited to this, but it may be configured in such a manner where accumulation diffusion layers 161 are provided in such a way as to be adjacent to gate insulation films 141 on the light incident surface side and be separated from light receiving sections 111-113; a channel region 131 is provided in a reverse conducting diffusion layer to transfer signal charges from the light receiving sections 111-113 to the accumulation diffusion layers 161; and solid-state image capturing devices adjacent to each other in a direction along the substrate surface are electrically separated from each other as an individual device by a reverse conducting diffusion layer 132 provided on a side surface of trenches 111a-113a with the depth from the substrate surface side opposite from the light incident surface to each of the plurality of the light receiving sections 111-113. In this case, the depths of the trenches 111a-113a can be set shallower, thereby making the manufacturing method easier.

Further, in Embodiment 1 described above, a case has been described where a signal output circuit is provided to select certain solid-state image capturing devices 100 among a plurality of solid-state image capturing devices 100 to output a signal, the signal output circuit formed by a plurality of transistors that are formed from the opposite side from the light incident surface side of the semiconductor substrate 101. However, the present invention is not limited to this, but this signal output circuit may be configured with a plurality of transistors that are formed from the light incident surface side of the semiconductor substrate 101.

As described above, the present invention is exemplified by the use of its preferred Embodiments 1 to 4. However, the present invention should not be interpreted solely based on Embodiments 1 to 4 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 4 of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in a field of a solid-state image capturing apparatus (e.g., CMOS image sensor, CCD image sensor and the like), particularly a solid-state image capturing apparatus using a process of separating and detecting electromagnetic wave having different wavelengths by using a plurality of light receiving sections that are laminated in a depth direction of semiconductor substrate; and an electronic information device (e.g., digital camera (digital video camera, digital still camera), a variety of image input cameras, scanner, facsimile, cell phone device equipped with camera and the like) using the solid-state image capturing apparatus as an image input device for an image capturing section thereof, productivity for the solid-state image capturing apparatus can be increased because a step of forming a color filter as a manufacturing process related to an optical characteristic unique to the solid-state image capturing apparatus can be eliminated. In addition, because the light receiving sections for respective color signals can be formed by laminating them, a light receiving region of each of the pixel sections may be enlarged, leading to high image quality due to the improved light receiving sensitivity.

In addition, since the readout gate electrodes are formed inside the trench sections of the semiconductor substrate and read out in a vertical direction from the light receiving sections corresponding to respective colors, the readout gate electrodes and the light receiving sections are adjacent to each other; and because the distances between the readout gate electrodes and the channel sections are short, signal charges can be read out by much lower readout voltage, thereby reducing power consumption. Further, since it is not needed to form a high concentration diffusion layer as a transfer path or to provide a readout gate electrode on the substrate surface, an establishment area can be smaller and a size of a light receiving region in each pixel section can be substantially larger, leading to high image quality due to the improved light receiving sensitivity.

Further, since wiring layers are provided on the opposite side surface from the light incident surface, it is not needed to arrange wiring layers in between pixel sections for transferring signal charges outputted from each pixel section (each light receiving section). Therefore, establishment areas for wiring layers will not cause the solid-state image capturing apparatus to lower its resolution. Further, it is possible to form a transistor necessary for amplifying signal charges and electrical resetting of signal charges from the light receiving sections on the opposite side of the light incident surface. Because the size of the light receiving region of each pixel section is not affected by an area for arranging the transistor, it will not cause the solid-state image capturing apparatus to lower its resolution, and the area of the light receiving region can be larger, leading to high image quality due to the improved light receiving sensitivity. In addition, note that a signal readout circuit and its wiring may be provided on the light incident side (between the light receiving sections; and between adjacent solid-state image capturing devices, for example). In this case, a depth of a trench can be shallow, thereby making the manufacturing easier.

Therefore, according to the present invention, the solid-state image capturing apparatus with high sensitivity and high resolution, which needs no color filter that is needed for a conventional solid-state image capturing apparatus and is capable of reading out signal charges corresponding to a plurality of colors separately with low voltage, can be realized with a simple manufacturing method with a step of forming a color filter eliminated. Further, an electronic information device using the solid-state image capturing apparatus as an image input device for an image capturing section thereof can also be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A Solid-state image capturing apparatus, in which a plurality of solid-state image capturing devices having a plurality of light receiving sections laminated in a depth direction of a semiconductor substrate are arranged according to a sequence in a direction along a substrate surface; and of electromagnetic waves of incident subject light, electromagnetic waves having wavelength bands corresponding to depths of the respective light receiving sections are detected at the respective light receiving sections in accordance with wavelength dependency of optical absorption coefficient of a semiconductor substrate material of the semiconductor substrate; and signal charges are generated respectively, wherein, trench sections are provided in such a way that the trench sections each reach from a light incident surface or a substrate surface opposite from the light incident surface of the semiconductor substrate to locations of the respective light receiving sections that do not overlap each other in a plane view, wherein, readout gate electrodes are provided at each trench sections, and electric charge transfer sections are provided, the electric charge transfer sections being capable of transferring electric charges independently from the plurality of the light receiving sections via side wall portions of the respective trenches to the light incident surface side or the substrate surface side opposite from the light incident surface at the time of driving the readout gate electrodes.

2. A solid-state image capturing apparatus according to claim 1, wherein the electric charge transfer sections are arranged in such a way that the trench sections are arranged adjacent to respective layers of the laminated light receiving sections in respective substrate plane directions, inner wall of the trench sections are covered with a gate insulation film, and the readout gate electrode is embedded inside each of the trench sections.

3. A solid-state image capturing apparatus according to claim 2, wherein a reverse conducting diffusion layer having an electric polarity different from that of the plurality of the light receiving sections is provided on a side wall of the trench sections along the gate insulation film covering the side wall.

4. A solid-state image capturing apparatus according to claim 1, wherein a reverse conducting diffusion layer having an electric polarity different from that of the plurality of the light receiving sections is provided on a side wall of the trench sections along the gate insulation film covering the side wall.

5. A solid-state image capturing apparatus according to claim 3, wherein an accumulation diffusion layer is provided, which is adjacent to the gate insulation film on the light incident surface or the substrate surface opposite from the light incident surface and is separated from each of the light receiving sections, and a channel region is provided in the reverse conducting diffusion layer to transfer signal charges from the light receiving section to the accumulation diffusion layer.

6. A solid-state image capturing apparatus according to claim 4, wherein an accumulation diffusion layer is provided, which is adjacent to the gate insulation film on the light incident surface or the substrate surface opposite from the light incident surface and is separated from each of the light receiving sections, and a channel region is provided in the reverse conducting diffusion layer to transfer signal charges from the light receiving section to the accumulation diffusion layer.

7. A solid-state image capturing apparatus according to claim 5, wherein the channel region is a channel diffusion layer whose electric polarity is different from that of the light receiving section.

8. A solid-state image capturing apparatus according to claim 6, wherein the channel region is a channel diffusion layer whose electric polarity is different from that of the light receiving section.

9. A solid-state image capturing apparatus according to claim 5, wherein a low concentration channel diffusion layer is formed in a region where a region for forming each of the plurality of the light receiving sections and the channel region overlap each other.

10. A solid-state image capturing apparatus according to claim 6, wherein a low concentration channel diffusion layer is formed in a region where a region for forming each of the plurality of the light receiving sections and the channel region overlap each other.

11. A solid-state image capturing apparatus according to claim 3, wherein the solid-state image capturing devices adjacent to each other in a direction along the substrate surface are electrically separated from each other as an individual device by the reverse conducting diffusion layer provided on a side surface of the trenches with the depth from either the substrate surface opposite from the light incident surface or from the light incident surface to each of the plurality of the light receiving sections.

12. A solid-state image capturing apparatus according to claim 4, wherein the solid-state image capturing devices adjacent to each other in a direction along the substrate surface are electrically separated from each other as an individual device by the reverse conducting diffusion layer provided on a side surface of the trenches with the depth from either the substrate surface opposite from the light incident surface or from the light incident surface to each of the plurality of the light receiving sections.

13. A solid-state image capturing apparatus according to claim 1, wherein the plurality of the light receiving sections are arranged in a square or rectangle lattice shape in a plane view, and the trench sections are arranged in different two or three directions along the respective edges in such a way that the trench sections are adjacent to the respective edges that are extended from a shape in which the plurality of the light receiving sections overlaps with each other in a plane view towards outside so that the extended edges do not overlap with each other in a plane view.

14. A solid-state image capturing apparatus according to claim 1, wherein the plurality of the light receiving sections are arranged in a hexagon and a honeycomb structure in a plane view, and the trench sections are arranged in different two or three directions along the respective edges in such a way that the trench sections are adjacent to the respective edges that are extended from a shape in which the plurality of the light receiving sections overlaps with each other in a plane view towards outside so that the extended edges do not overlap with each other in a plane view.

15. A solid-state image capturing apparatus according to claim 1, wherein the plurality of the light receiving sections are arranged in a square or rectangle lattice shape in a plane view, and the trench sections are arranged in different four directions along the respective portions of the edges in such a way that the trench sections are adjacent to the respective portions of the edges that are extended from a shape in which the plurality of the light receiving sections overlaps with each other in a plane view towards outside so that the extended portions of the edges do not overlap with each other in a plane view.

16. A solid-state image capturing apparatus according to claim 1, wherein the semiconductor is a silicon substrate with an epitaxial layer, and the plurality of the light receiving sections are formed with photodiodes that are formed by semiconductor junction of different conductivity.

17. A solid-state image capturing apparatus according to claim 1, wherein there is provided a N number (N is a natural number) of light receiving sections, as the plurality of the light receiving sections, from a first light receiving section for detecting an electromagnetic wave of a first wavelength band to an Nth light receiving section for detecting an electromagnetic wave of an Nth wavelength band.

18. A solid-state image capturing apparatus according to claim 1, wherein there is provided a first light receiving section for detecting an electromagnetic wave of a first wavelength band and a second light receiving section for detecting an electromagnetic wave of a second wavelength band as the plurality of the light receiving sections.

19. A solid-state image capturing apparatus according to claim 1, wherein there is provided a first light receiving section for detecting an electromagnetic wave of a first wavelength band, a second light receiving section for detecting an electromagnetic wave of a second wavelength band and a third light receiving section for detecting an electromagnetic wave of a third wavelength band as the plurality of the light receiving sections.

20. A solid-state image capturing apparatus according to claim 1, wherein there is provided a first light receiving section for detecting an electromagnetic wave of a first wavelength band and a second light receiving section for detecting an electromagnetic wave of a second wavelength band, a third light receiving section for detecting an electromagnetic wave of a third wavelength band, and a fourth light receiving section for detecting an electromagnetic wave of a fourth wavelength band as the plurality of the light receiving sections.

21. A solid-state image capturing apparatus according to claim 17, wherein a depth from a light incident side surface of the semiconductor substrate to the first light receiving section detects white light in the range of greater or equal to 0.2 µm and below or equal to 2.0 µm and a depth from the light incident side surface to the second light receiving section detects infrared light in the range of 3.0 µm±0.3 µm.

22. A solid-state image capturing apparatus according to claim 18, wherein a depth from a light incident side surface of the semiconductor substrate to the first light receiving section detects white light in the range of greater or equal to 0.2 µm and below or equal to 2.0 µm and a depth from the light incident side surface to the second light receiving section detects infrared light in the range of 3.0 µm±0.3 µm.

23. A solid-state image capturing apparatus according to claim 17, wherein the depth from the light incident side surface of the semiconductor substrate to the first light receiving section detects ultraviolet light in the range of greater or equal to 0.1 µm and below or equal to 0.2 µm and the depth from the light incident side surface to the second light receiving section detects white light in the range of greater or equal to 0.2 µm and below or equal to 2.0 µm as the thickness of a depletion layer.

24. A solid-state image capturing apparatus according to claim 18, wherein the depth from the light incident side surface of the semiconductor substrate to the first light receiving section detects ultraviolet light in the range of greater or equal to 0.1 µm and below or equal to 0.2 µm and the depth from the light incident side surface to the second light receiving section detects white light in the range of greater or equal to 0.2 µm and below or equal to 2.0 µm as the thickness of a depletion layer.

25. A solid-state image capturing apparatus according to claim 17, wherein the depth from the light incident side surface of the semiconductor substrate to the first light receiving section detects ultraviolet light in the range of greater or equal to 0.1 µm and below or equal to 0.2 µm and the depth from the light incident side surface to the second light receiving section detects infrared light in the range of 3.0 µm±0.3 µm.

26. A solid-state image capturing apparatus according to claim 18, wherein the depth from the light incident side surface of the semiconductor substrate to the first light receiving section detects ultraviolet light in the range of greater or equal to 0.1 µm and below or equal to 0.2 µm and the depth from the light incident side surface to the second light receiving section detects infrared light in the range of 3.0 µm±0.3 µm.

27. A solid-state image capturing apparatus according to claim 19, wherein the depth from the light incident side surface of the semiconductor substrate to the first light receiving section is in the range of between above or equal to 0.1 µm and below or equal to 0.4 µm, the depth from the light incident side surface of the semiconductor substrate to the second light receiving section is in the range of between above or equal to 0.4 µm and below or equal to 0.8 µm, and the depth from the light incident side surface of the semiconductor substrate to the third light receiving section is in the range of between above or equal to 0.8 µm and below or equal to 2.5 µm, thereby detecting three primary colors.

28. A solid-state image capturing apparatus according to claim 20, wherein the depth from the light incident side surface of the semiconductor substrate to the first light receiving section is in the range of between above or equal to 0.1 µm and below or equal to 0.4 µm, the depth from the light incident side surface of the semiconductor substrate to the second light receiving section is in the range of between above or equal to 0.3 µm and below or equal to 0.6 µm, the depth from the light incident side surface of the semiconductor substrate to the third light receiving section is in the range of between above or equal to 0.4 µm and below or equal to 0.8 µm, and the depth from the light incident side surface of the semiconductor substrate to the fourth light receiving section is in the range between above or equal to 0.8 µm and below or equal to 2.5 µm, thereby detecting the three primary colors and emerald color.

29. A solid-state image capturing apparatus according to claim 1, wherein a signal output circuit is provided in each of the plurality of the solid-state image capturing devices to select certain solid-state image capturing devices among the plurality of solid-state image capturing devices to output a signal, the signal output circuit configured by a plurality of transistors that are formed from either the opposite side from the light incident surface side of the semiconductor substrate or the light incident surface side.

30. A solid-state image capturing apparatus according to claim 1, wherein the signal output circuit is provided in each of the plurality of the solid-state image capturing devices to select certain solid-state image capturing devices among the plurality of solid-state image capturing devices to output a signal, and the transistors configuring the signal output circuit are provided in and on impurity diffusion layer wells in the solid-state image capturing devices.

31. A solid-state image capturing apparatus according to claim 29, wherein the signal output circuit has an amplification transistor for amplifying a signal in response to signal voltage charge-transferred from the light receiving sections to the accumulation diffusion layers and a reset transistor for resetting the signal voltage of the accumulation diffusion layers to predetermined voltage.

32. A solid-state image capturing apparatus according to claim 30, wherein the signal output circuit has an amplification transistor for amplifying a signal in response to signal voltage charge-transferred from the light receiving sections to the accumulation diffusion layers and a reset transistor for resetting the signal voltage of the accumulation diffusion layers to predetermined voltage.

33. A solid-state image capturing apparatus according to any one of claims 29, wherein a signal output path from the signal output circuit is configured by a wiring layer formed on the opposite side from the light incident surface side of the semiconductor substrate.

34. A solid-state image capturing apparatus according to any one of claims 30, wherein a signal output path from the signal output circuit is configured by a wiring layer formed on the opposite side from the light incident surface side of the semiconductor substrate.

35. A solid-state image capturing apparatus according to claim 2, wherein the gate insulation film is an oxide film or a high dielectric insulation film.

36. A solid-state image capturing apparatus according to claim 4, wherein the gate insulation film is an oxide film or a high dielectric insulation film.

37. A solid-state image capturing apparatus according to claim 35, wherein the oxide film is a silicon oxide film.

38. A solid-state image capturing apparatus according to claim 36, wherein the oxide film is a silicon oxide film.

39. A solid-state image capturing apparatus according to claim 35, wherein the high dielectric insulation film is a hafnium oxide.

40. A solid-state image capturing apparatus according to claim 36, wherein the high dielectric insulation film is a hafnium oxide.

41. A solid-state image capturing apparatus according to claim 2, wherein the readout gate electrode is made of material including doped silicon material or metal material.

42. A solid-state image capturing apparatus according to claim 1, wherein the solid-state image capturing apparatus is a CMOS image sensor or a CCD image sensor.

43. An electronic information device using the solid-state image capturing device according to any one of claim 1 as an image input device.

44. A solid-state image capturing apparatus manufacturing method, in which a plurality of solid-state image capturing devices having a plurality of light receiving sections laminated in a depth direction of a semiconductor substrate are arranged according to a sequence in a direction along the substrate surface, and of electromagnetic waves of incident subject light, electromagnetic waves having wavelength bands corresponding to depths of the respective light receiving sections are detected at the respective light receiving sections in accordance with wavelength dependency of optical absorption coefficient of a semiconductor substrate material of the semiconductor substrate; and signal charges are generated, the method comprising:

a light receiving section forming step of forming from a first light receiving section diffusion layer to an Nth light receiving section diffusion layer (N is a natural number) in sequence in a depth direction of the semiconductor substrate in such a manner that overlapping regions of the light receiving section diffusion layers are extended with their respective edges so that each of the light receiving section diffusion layers has a portion not overlapping with that of the other light receiving section diffusion layers in a plane view;

a reverse conducting diffusion layer forming step of forming a reverse conducting diffusion layer having an electric polarity that is different from that of each of the light receiving sections, on a light incident surface of the substrate surface;

a trench forming step of forming a trench, which has a depth to reach from the substrate surface opposite from the light incident surface to each of the light receiving sections and arranged to be adjacent to each of the edges of laminated light receiving sections in respective substrate plane directions;

a trench side surface diffusion layer forming step of forming a reverse conducting diffusion layer having an electric polarity that is different from that of each of the light receiving sections, on a side surface of the trench;

a gate insulation film forming step of forming a gate insulation film in such a way to cover inside the trench;

a gate electrode forming step of filling inside the trench to form a readout gate electrode; and an accumulation diffusion layer forming step of forming an accumulation diffusion layer, which is adjacent to the gate insulation film on the substrate surface opposite from the light incident side and is separated from each of the light receiving sections.

* * * * *